US012575166B2

(12) United States Patent
Sato et al.

(10) Patent No.: US 12,575,166 B2
(45) Date of Patent: Mar. 10, 2026

(54) SEMICONDUCTOR DEVICE

(71) Applicant: FUJI ELECTRIC CO., LTD.,
Kanagawa (JP)

(72) Inventors: Shigeki Sato, Matsumoto (JP); Seiji Momota, Matsumoto (JP); Tadashi Miyasaka, Matsumoto (JP)

(73) Assignee: FUJI ELECTRIC CO., LTD.,
Kanagawa (JP)

( * ) Notice: Subject to any disclaimer, the term of this patent is extended or adjusted under 35 U.S.C. 154(b) by 0 days.

(21) Appl. No.: 18/539,311

(22) Filed: Dec. 14, 2023

(65) Prior Publication Data

US 2024/0145465 A1    May 2, 2024

Related U.S. Application Data

(63) Continuation of application No. 16/228,803, filed on Dec. 21, 2018, now Pat. No. 11,855,077.

(30) Foreign Application Priority Data

Feb. 28, 2018    (JP) .................................. 2018-034260

(51) Int. Cl.
*H10D 84/40*        (2025.01)
*H10D 8/00*        (2025.01)
                (Continued)

(52) U.S. Cl.
CPC ........... *H10D 84/406* (2025.01); *H10D 8/411* (2025.01); *H10D 8/422* (2025.01); *H10D 12/481* (2025.01);
                (Continued)

(58) Field of Classification Search
CPC ............ H01L 27/0727; H01L 27/0664; H10D 12/481; H10D 12/441; H10D 62/142; H10D 62/106; H10D 8/00
See application file for complete search history.

(56) References Cited

U.S. PATENT DOCUMENTS

| | | | |
|---|---|---|---|
| 5,687,049 A | 11/1997 | Mantani |
| 8,072,241 B2 | 12/2011 | Kouno |
| (Continued) | | | |

FOREIGN PATENT DOCUMENTS

| | | |
|---|---|---|
| CN | 102318072 A | 1/2012 |
| JP | H03106065 A | 5/1991 |
| (Continued) | | |

OTHER PUBLICATIONS

Office Action issued for counterpart Japanese Application No. 2018-034260, transmitted from the Japanese Patent Office on Jan. 18, 2022 (drafted on Jan. 7, 2022).

(Continued)

*Primary Examiner* — Samuel A Gebremariam
*Assistant Examiner* — Jonas T Beardsley

(57) ABSTRACT

A semiconductor device is preferably excellent in characteristics such as a loss characteristic. Provided is a semiconductor device including a semiconductor substrate, including an upper-surface electrode provided on an upper surface of the semiconductor substrate; an lower-surface electrode provided on a lower surface of the semiconductor substrate; a transistor portion provided in the semiconductor substrate and connected to the upper-surface electrode and the lower-surface electrode; a first diode portion provided in the semiconductor substrate and connected to the upper-surface electrode and the lower-surface electrode; and a second diode portion provided in the semiconductor substrate and connected to the upper-surface electrode and the lower-surface electrode, wherein the first diode portion and the second diode portion have different resistivities in a depth direction of the semiconductor substrate.

18 Claims, 17 Drawing Sheets

(51) Int. Cl.

| | |
|---|---|
| *H10D 12/00* | (2025.01) |
| *H10D 62/10* | (2025.01) |
| *H10D 62/13* | (2025.01) |
| *H10D 62/17* | (2025.01) |
| *H10D 62/53* | (2025.01) |
| *H10D 64/00* | (2025.01) |
| *H10D 64/23* | (2025.01) |
| *H10D 64/27* | (2025.01) |

(52) U.S. Cl.
CPC ......... *H10D 62/105* (2025.01); *H10D 62/117* (2025.01); *H10D 62/151* (2025.01); *H10D 62/393* (2025.01); *H10D 62/53* (2025.01); *H10D 64/231* (2025.01); *H10D 64/513* (2025.01); *H10D 64/117* (2025.01)

(56) References Cited

U.S. PATENT DOCUMENTS

| | | | | |
|---|---|---|---|---|
| 8,723,220 | B2 | 5/2014 | Soeno | |
| 2009/0057832 | A1 | 3/2009 | Kono | |
| 2009/0242931 | A1 | 10/2009 | Tsuzuki | |
| 2010/0140658 | A1* | 6/2010 | Koyama | H10D 84/617 |
| | | | | 257/E21.705 |
| 2011/0297934 | A1 | 12/2011 | Soeno | |
| 2013/0242438 | A1 | 9/2013 | Fukuda | |
| 2015/0132895 | A1 | 5/2015 | Kamijo | |
| 2015/0249083 | A1 | 9/2015 | Okawara | |
| 2016/0035867 | A1 | 2/2016 | Pfirsch | |
| 2016/0111419 | A1 | 4/2016 | Naito | |
| 2017/0033099 | A1 | 2/2017 | Iwasaki | |
| 2017/0077217 | A1 | 3/2017 | Ogawa | |
| 2017/0162560 | A1 | 6/2017 | Takahashi | |
| 2017/0263603 | A1* | 9/2017 | Hata | H10D 84/617 |
| 2018/0090487 | A1 | 3/2018 | Fujii | |
| 2018/0151557 | A1 | 5/2018 | Tanabe | |
| 2018/0277638 | A1* | 9/2018 | Hoshi | H10D 84/035 |
| 2019/0157389 | A1 | 5/2019 | Takano | |

FOREIGN PATENT DOCUMENTS

| | | |
|---|---|---|
| JP | H09233838 A | 9/1997 |
| JP | 2002110986 A | 4/2002 |
| JP | 2009099690 A | 5/2009 |
| JP | 2009267394 A | 11/2009 |
| JP | 2010171179 A | 8/2010 |
| JP | 2010192565 A | 9/2010 |
| JP | 2013198185 A | 9/2013 |
| JP | 2015005866 A | 1/2015 |
| JP | 2015095618 A | 5/2015 |
| JP | 2017059662 A | 3/2017 |
| WO | 2018016029 A1 | 1/2018 |

OTHER PUBLICATIONS

Office Action issued for counterpart Japanese Application No. 2022-126638, transmitted from the Japanese Patent Office on Aug. 29, 2023 (drafted on Aug. 24, 2023).

Those references were submitted as IDS or found by the examiner over the earlier U.S. Appl. No. 16/228,803, filed Dec. 21, 2018.

* cited by examiner 70    80    70    80    70    112    110    10

114          114          120          114

100

100

SEMICONDUCTOR DEVICE

CROSS-REFERENCE TO RELATED APPLICATIONS

This application is a continuation of U.S. patent application Ser. No. 16/228,803, filed on Dec. 21, 2018, the entire contents of which are explicitly incorporated herein by reference. The application also claims priority from the following Japanese patent application, which is explicitly incorporated herein by reference:

NO. 2018-034260 filed in JP on Feb. 28, 2018.

BACKGROUND

1. Technical Field

The present invention relates to a semiconductor device.

2. Related Art

A semiconductor device in which transistor devices such as an insulated gate bipolar transistor (IGBT) and diode elements such as a free wheeling diode (FWD) are provided in parallel is known in the prior art (Refer to Patent document 1, for example).

Patent document 1: Japanese Patent Application Publication No. 2009-99690.

SUMMARY

A semiconductor device is preferably excellent in characteristics such as a loss characteristic.

According to one aspect of the present invention, provided is a semiconductor device including a semiconductor substrate. The semiconductor device may include an upper-surface electrode provided on an upper surface of the semiconductor substrate. The semiconductor device may include a lower-surface electrode provided on a lower surface of the semiconductor substrate. The semiconductor device may include a transistor portion provided in the semiconductor substrate and connected to the upper-surface electrode and the lower-surface electrode. The semiconductor device may include a first diode portion provided in the semiconductor substrate and connected to the upper-surface electrode and the lower-surface electrode. The semiconductor device may include a second diode portion provided in the semiconductor substrate and connected to the upper-surface electrode and the lower-surface electrode. The first diode portion and the second diode portion may have different resistivities in the depth direction of the semiconductor substrate.

The first diode portion and the second diode portion may each have a drift region of a first conductivity type provided inside the semiconductor substrate. The first diode portion and the second diode portion may each have an anode region of a second conductivity type provided between the drift region and the upper surface of the semiconductor substrate. The first diode portion may be separated from the second diode portion by a separation well region of the second conductivity type having a higher doping concentration than the anode region and formed from the upper surface of the semiconductor substrate to a position deeper than the anode region.

A doping concentration of the anode region in the first diode portion may be different from that in the second diode portion.

In at least one of the first diode portion and the second diode portion, lifetime killers controlling a carrier lifetime may be provided inside the semiconductor substrate. The concentration of the lifetime killers in the first diode portion may be different from that in the second diode portion.

The thickness of the semiconductor substrate in the first diode portion may be different from that in the second diode portion.

The total area of a plurality of the first diode portions on the upper surface of the semiconductor substrate may be different from that of a plurality of the second diode portions on the upper surface of the semiconductor substrate.

The total area of the plurality of second diode portions may be smaller than that of the plurality of first diode portions and the resistivity of the second diode portions may be lower than that of the first diode portions.

The total area of the plurality of second diode portions may be smaller than that of the plurality of first diode portions and the resistivity of the second diode portions may be higher than that of the first diode portions.

The total area of the plurality of second diode portions may be between 0.1% and 10%, inclusive, of the total area of the plurality of first diode portions.

The transistor portion may have a source region of a first conductivity type provided between a base region and the upper surface of the semiconductor substrate, the source region having a higher doping concentration than the drift region. The transistor portion may have a gate trench portion provided from the upper surface of the semiconductor substrate so as to reach the drift region and provided to extend along a predetermined extending direction on the upper surface of the semiconductor substrate. The transistor portion may have a first well region provided to overlap, on the upper surface of the semiconductor substrate, an edge part of the gate trench portion in the extending direction and provided from the upper surface of the semiconductor substrate to a position deeper than the edge part of the gate trench portion, the first well region having a higher doping concentration than the base region. The separation well region may have a higher doping concentration than the first well region in the transistor portion.

The separation well region may be provided to extend deeper than the first well region of the transistor portion.

According to a second aspect of the present invention, provided is a semiconductor device including a semiconductor substrate. The semiconductor device may include an upper-surface electrode provided on an upper surface of the semiconductor substrate. The semiconductor device may include a lower-surface electrode provided on a lower surface of the semiconductor substrate. The semiconductor device may include a transistor portion provided in the semiconductor substrate and connected to the upper-surface electrode and the lower-surface electrode. The semiconductor device may include a first diode portion provided in the semiconductor substrate and connected to the upper-surface electrode and the lower-surface electrode. The semiconductor device may include a second diode portion provided in the semiconductor substrate and connected to the upper-surface electrode and the lower-surface electrode. The semiconductor device may include a first resistance portion provided on a region in the upper-surface electrode, the first diode portion being connected to the region. The semiconductor device may include a second resistance portion provided on a region in the upper-surface electrode, the second diode portion being connected to the region. The first resistance portion and the second resistance portion may have different resistance values in a depth direction of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to solutions provided by aspects of the invention.

In this specification, one side in the direction parallel to the depth direction of a semiconductor substrate is referred to as an "upper" side, and the other side is referred to as a "lower" side. One surface of two principal surfaces of a substrate, a layer or some other member is referred to as an upper surface, and the other is referred to as a lower surface. The "upper" and "lower" directions are not limited to the gravitational direction or the directions when a semiconductor device is mounted.

In this specification, technical matters are described using orthogonal coordinate axes of X-axis, Y-axis and Z-axis. The orthogonal coordinate axes merely specify the relative positions of components and do not exclusively indicate particular directions. For example, the Z-axis does not exclusively indicate the height direction relative to the ground. Note that +Z-axis direction and −Z-axis direction are directions opposite to each other. When the Z-axis direction is referred to without specifying whether it is positive or negative, it means a direction parallel to the +Z-axis and the −Z-axis.

Although in each example shown, a first conductivity type is N type and a second conductivity type is P type, the first conductivity type may be P type and the second conductivity type may be N type. In this case, conductivity types of a substrate, a layer, a region or the like in each example become opposite polarities, respectively. Also, N means the majority carriers are electrons and P means the majority carriers are holes. For + or − added to N or P, + means the carrier concentration is higher than when—is not added and—means the carrier concentration is lower than when—is not added.

Figure 1:
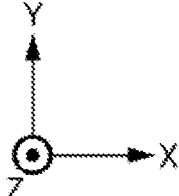
FIG. 1 is a top view illustrating one example of a semiconductor device 100 according to one embodiment of the present invention.

FIG. 1 is a top view illustrating one example of a semiconductor device 100 according to one embodiment of the present invention. The semiconductor device 100 includes a semiconductor substrate 10. The semiconductor device 100 in the present example is a semiconductor chip formed on the semiconductor substrate 10. In the present example, a plane parallel to the upper surface of the semiconductor substrate 10 is a XY plane and a direction perpendicular to the XY plane (i.e., the depth direction of the semiconductor substrate 10) is a Z-axis direction. The semiconductor substrate 10 in the present example has a rectangular shape having sides parallel to the X-axis and sides parallel to the Y-axis in the top view.

The semiconductor device 100 includes transistor portions 70, first diode portions 80 and second diode portions 120 provided on the semiconductor substrate 10. In each transistor portion 70, a transistor such as an IGBT is provided, and in each first diode portion 80 and each second diode portion 120, a diode such as an FWD is provided.

In the present example, the transistor portions 70 and the first diode portions 80 are alternately arranged in the X-axis direction. Each of the transistor portions 70 and the first diode portions 80 may have a stripe shape the longitudinal axis of which is the Y-axis. The region in which the transistor portions 70 and the first diode portions 80 are provided is referred to as a main element portion 110.

The second diode portion 120 may be arranged in sequence along with the transistor portion 70 and the first diode portion 80 in the main element portion 110, or may be arranged in a region other than the main element portion 110 as shown in FIG. 1. The semiconductor device 100 includes one or more pads 114 arranged in the region other than the main element portion 110.

The pads 114 are connected to an upper-surface electrode, for example, an emitter electrode, a gate metal layer or the like, arranged above the semiconductor substrate 10. Also, any of the pads 114 may be electrically connected to a diode for temperature detection provided on the semiconductor substrate 10. In the example of FIG. 1, the second diode portions 120 are arranged side by side with the pads 114 in the X-axis direction in the region other than the main element portion 110. Note that the arrangement of the second diode portions 120 is not so limited.

The first diode portions 80 and the second diode portions 120 are provided in parallel to each other. In the present example, the upper-surface electrode is provided on the upper surface of the semiconductor substrate 10 and the lower-surface electrode is provided on the lower surface of the semiconductor substrate 10. The first diode portions 80 and the second diode portions 120 are connected to the common upper-surface electrode and lower-surface electrode.

The first diode portions 80 and the second diode portions 120 have different resistivities in the depth direction of the semiconductor substrate 10. In this specification, the resistance between the upper-surface electrode and the lower-surface electrode per unit area on the upper surface of the semiconductor substrate 10 is referred to as a resistivity. In other words, the values obtained by dividing the resistance value of the first diode portions 80 and the resistance value of the second diode portions 120 between the upper-surface electrode and the lower-surface electrode respectively by the total area of the first diode portions 80 and the total area of the second diode portions 120 are referred to as a resistivity. The resistivity may be calculated using only the resistance value of the semiconductor substrate 10, or may be calculated with the resistances of the electrodes arranged on the upper surface and the lower surface of the semiconductor substrate 10, pads, resistive elements and the like taken into consideration in addition to the resistance of the substrate. A value of the ON-resistance when the diode portions are in ON-operation may be used as the resistance value of the semiconductor substrate 10.

The characteristics of the semiconductor device 100 can be readily adjusted by using the first diode portions 80 and the second diode portions 120 the resistivities of which are different from each other. For example, the current peak Irp of the diode portions during reverse recovery can be suppressed by increasing the resistivity of either of the diode portion 80 or the diode portion 120.

Also, the total area of the first diode portions 80 may be different from the total area of the second diode portions 120. Also, the area per first diode portion 80 may be different from the area per second diode portion 120. As an example, the area per second diode portion 120 is smaller than the area per first diode portion 80 and the total area of the second diode portions 120 is smaller than the total area of the first diode portions 80. In the present example, the region separated by the transistor portions 70 is one first diode portion 80. Also, as described below, the region separated by a separation well region may be one second diode portion 120.

The characteristics of the semiconductor device 100 can be adjusted more easily by making the total areas of the first diode portions 80 and the second diode portions 120 different from each other. For example, mounting the semiconductor device 100 in a product causes an unavoidable inductance component due to the mounting. As the inductance component increases, a surge voltage increases and an oscillation is generated. To address this problem, a peak current Irp of the diode portion having a small area during reverse recovery can be suppressed by making the resistivity of the small-area diode portion higher than that of the large-area diode portion. Furthermore, since the small-area diode portion has high-speed responsiveness due to its small capacity and high-speed responsiveness due to its small impedance component and therefore small impedance delay, the oscillation of the diode portion during reverse recovery can be suppressed.

Also, if the resistivity of the small-area diode portion is lower than the resistivity of the large-area diode portion (that is, the resistivity of the large-area diode portion is relatively large), the peak current Irp during reverse recovery can be suppressed significantly since the carrier injection amount for the entire diode portions is suppressed significantly, and the current change over time (−di/dt) when the current converges from the peak current Irp can also be reduced. Also, following the current, rising and the falling speeds of the voltage between the anode and the cathode are increased and on-state power loss and reverse recovery loss of the semiconductor device 100 can be reduced.

Although the total area of the second diode portions 120 is small compared to the total area of the first diode portions 80 in the present example, the relationship of the areas may be reversed. The total area of the second diode portions 120 may be between 1/1000 and 1/10, inclusive, of the total area of the first diode portions 80. Such area ratios can improve the characteristics during reverse recovery while the prescribed diode characteristics due to the first diode portion 80 are maintained. The difference between the resistivities of the first diode portions 80 and the second diode portions 120 may be between 10% and 200%, inclusive.

The semiconductor device 100 in the present example includes an edge termination structure 112 provided to surround the main element portion 110 on the upper surface of the semiconductor substrate 10. The edge termination structure 112 has a guard ring, a field plate or the like, and a depletion layer inside the semiconductor substrate 10 is caused to be extended to the edge of the semiconductor substrate 10. This improves the breakdown voltage of the semiconductor device 100.

In the present example, the respective pads 114 are arranged in the region surrounded by the edge termination structure 112 on the upper surface of the semiconductor substrate 10. The second diode portions 120 may be arranged in the region surrounded by the edge termination structure 112 on the upper surface of the semiconductor substrate 10 and may be arranged outside the edge termination structure 112. In the example of FIG. 1, the second diode portions 120 are arranged in the region surrounded by the edge termination structure 112 on the upper surface of the semiconductor substrate 10.

Figure 2:
FIG. 2 is a diagram partially illustrating an upper surface of a semiconductor substrate 10.

FIG. 2 is a diagram partially illustrating an upper surface of a semiconductor substrate 10. The semiconductor device 100 in the present example includes in a main element portion 110, gate trench portions 40, dummy trench portions 30, source regions 12, base regions 14, contact regions 15 and a first well region 17 that are provided inside the semiconductor substrate 10.

The semiconductor device 100 in the present example includes a gate runner portion 51 provided above the upper surface of the semiconductor substrate 10. Although an emitter electrode is also formed above the upper surface of the semiconductor substrate 10, it is omitted in the FIG. 2. The emitter electrode is formed of a conductive material such as aluminum. The gate runner portion 51 is formed of a conductive material such as polysilicon in which impurities are doped. The emitter electrode is provided above the upper surface of the semiconductor substrate 10 in the main element portion 110 as well as the second diode portion 120. One-piece emitter electrode may be provided in the main element portion 110 and the second diode portion 120.

Although insulating films are provided between the emitter electrode and the gate runner portion 51 and between the emitter electrode and the upper surface of the semiconductor substrate 10, they are omitted in FIG. 2. In the present example, contact holes 54 and contact holes 56 are provided to penetrate the insulating films.

The emitter electrode is in contact with the source regions 12, the contact regions 15, the base regions 14 and the first well region 17 on the upper surface of the semiconductor substrate 10 through the contact holes 54 and the like. The contact holes 54 in the present example are each provided between the neighboring trench portions arrayed along the X-axis direction. Also, the emitter electrode is connected to dummy conductive portions in the dummy trench portions 30 through the contact holes 56. Connection portions 57 formed of a conductive material such as polysilicon in which impurities are doped may be provided between the emitter electrode and the dummy conductive portions. The connection portions 57 are provided on the upper surface of the semiconductor substrate 10 across the insulating film such as a thermally oxidized film. In the present example, the contact holes 56 are arranged at the end of the dummy trench portions 30 in the Y-axis direction.

An insulating film such as a thermally oxidized film is provided between the gate runner portion 51 and the semiconductor substrate 10. The gate runner portion 51 is connected to the gate conductive portions in the gate trench portions 40 on the upper surface of the semiconductor substrate 10. The gate runner portion 51 is not connected to the dummy conductive portions in the dummy trench portions 30.

One or more gate trench portions 40 and one or more dummy trench portions 30 are arrayed along the X-axis direction at prescribed intervals on the upper surface of the semiconductor substrate 10. In the transistor portion 70, the one or more gate trench portions 40 and the one or more dummy trench portions 30 are arranged alternately along the X-axis direction. In the first diode portion 80, the one or more dummy trench portions 30 are arranged along the X-axis direction.

Each gate trench portion 40 in the present example may have linear parts 41 which extend in a linear shape along the Y-axis direction and an edge part 43 which connects the two linear parts 41 at the end of the linear part 41. At least a part of the edge part 43 is preferably formed in a curved shape on the upper surface of the semiconductor substrate 10. The electric field concentration at the end of the linear part 41 can be relaxed by connecting the edges of the two linear parts 41 of each gate trench portion 40 at the edge part 43.

One or more dummy trench portions 30 are provided between the linear parts 41 of each of the gate trench portions 40. Each dummy trench portion 30 may be a U-shaped portion with two linear parts and an edge part as with the gate trench portions 40 or may be a linear-shaped portion with linear parts only and no edge part, or U-shaped portions and linear-shaped portions may exist together. The dummy trench portions 30 are provided in a position where they do not overlap the gate runner portion 51.

The base regions 14 of the second conductivity type are provided in the regions sandwiched between the linear parts of respective trench portions on the upper surface of the semiconductor substrate 10. Each base region 14 in the present example is of P− type. The contact regions 15 of the second conductivity type, which have a higher doping concentration than the base region 14 (in the present example, the P+ type) are selectively provided on the upper surface of the base region 14. Note that the first diode portion 80 may not be provided with the contact regions 15. In the present example, a doping concentration refers to the concentration of impurities per unit volume. The doping concentration may also refer to the concentration of the impurities which are active as donors or acceptors. Also, the doping concentration of each region may refer to the maximum doping concentration of the region.

The source regions 12 of the first conductivity type are selectively formed on the upper surface of the base region 14 in the transistor portion 70. The source regions 12 in the present example are of N+ type. In the present example, the contact regions 15 and the source regions 12 in the transistor portion 70 are alternately provided along the Y-axis direction and are exposed on the upper surface of the semiconductor substrate 10. Note that arrangement of the contact regions 15 and the source regions 12 is not so limited. The source regions 12 may be arranged along the linear parts 41 of the gate trench portions 40. No source regions 12 are formed in the first diode portion 80.

The first well region 17 is provided to overlap the edge parts 43 of the gate trench portions 40 on the upper surface of the semiconductor substrate 10. In other words, on the surface parallel to the upper surface of the semiconductor substrate 10, the edge parts 43 of the gate trench portions 40 are arranged within the region in which the first well region 17 is provided. At least the endmost portion of the edge part 43 in the Y-axis direction is arranged to overlap the first well region 17. The first well region 17 in the present example is a region of P+ type, which has a higher doping concentration than the base region 14.

The first well region 17 may be provided to surround all the gate trench portions 40 and all the dummy trench portions 30 on the upper surface of the semiconductor substrate 10. All the source regions 12 may be arranged within the region surrounded by the first well region 17 on the upper surface of the semiconductor substrate 10.

The second diode portion 120 in the present example is provided on the outer side of the first well region 17 on the upper surface of the semiconductor substrate 10. The outer side of the first well region 17 may refer to the region located at the opposite side of the source regions 12 across the first well region 17 on the upper surface of the semiconductor substrate 10. If the first well region 17 is provided to surround a prescribed region on the upper surface of the semiconductor substrate 10, the outer side of the first well region 17 may refer to the region which is not surrounded by the first well region 17.

The second diode portion 120 in the present example has an anode region 126 of the second conductivity type (in the present example, the P− type), which is exposed on the upper surface of the semiconductor substrate 10. The anode region 126 and a drift region of the first conductivity type formed inside the semiconductor substrate 10 form a p-n junction. In another example, the second diode portion 120 may be a Schottky diode.

The second diode portion 120 may have a second well region 122 provided to surround the anode region 126 on the upper surface of the semiconductor substrate 10. The second well region 122 is one example of a separation well region. The second well region 122 is a region of the second conductivity type (in the present example, the P+ type), which have a higher doping concentration than either of the anode region 126 and the base region 14. As shown in FIG. 2, the second diode portion 120 and the first diode portion 80 may be arranged having the gate runner portion 51 therebetween and may be arranged on the same side of the gate runner portion 51.

Figure 3:
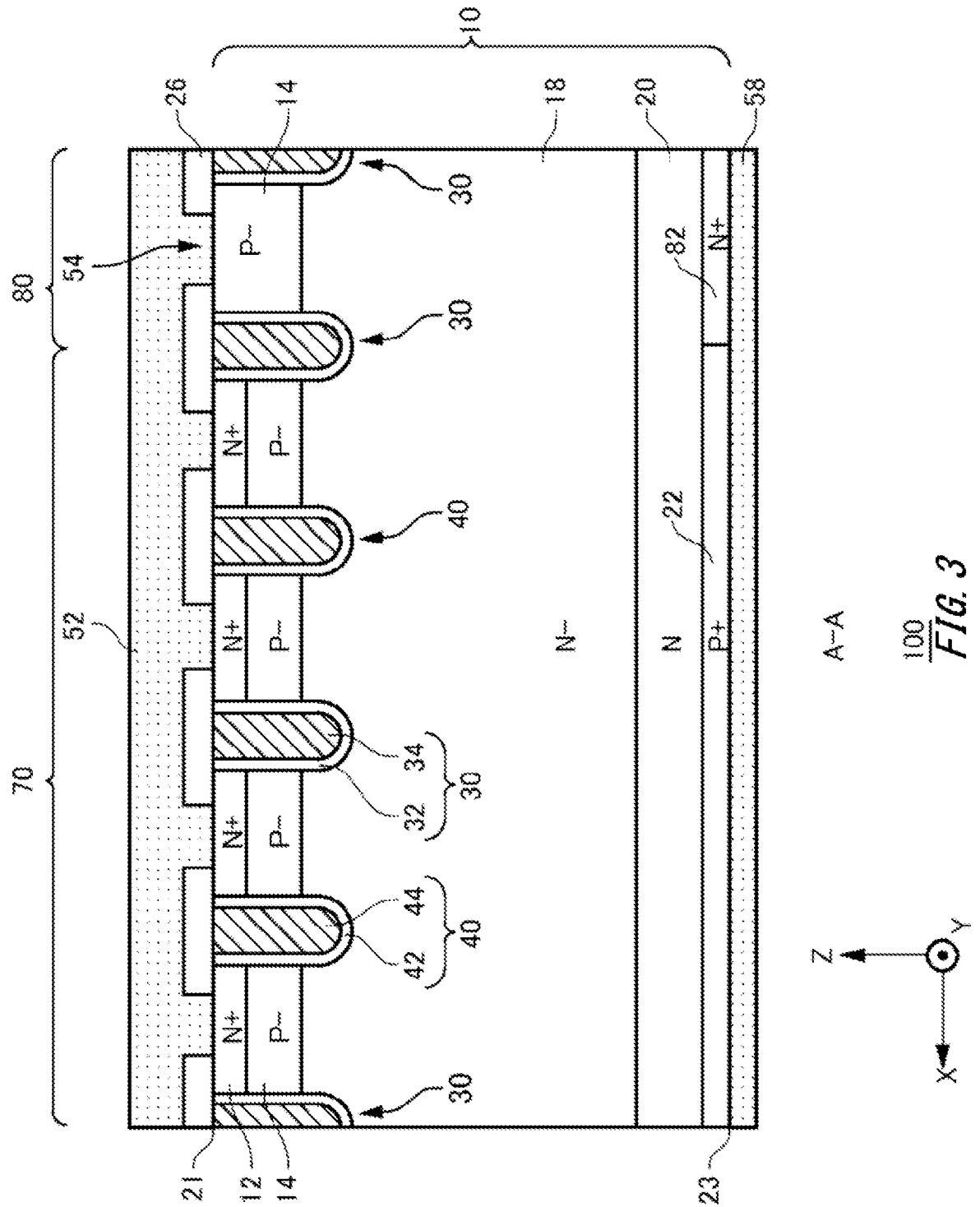
FIG. 3 is a diagram illustrating one example of a cross section taken along A-A in FIG. 2.

FIG. 3 is a diagram illustrating one example of a cross section taken along A-A in FIG. 2. The cross section taken along A-A in the present example is a XZ plane crossing the source region 12 in the main element portion 110. The semiconductor device 100 in the present example includes a semiconductor substrate 10, an insulating film 26, an emitter electrode 52 and a collector electrode 58 in the cross section. The collector electrode 58 may be formed of the same material that the emitter electrode 52 is formed of. The emitter electrode 52 is one example of an upper-surface electrode and the collector electrode 58 is one example of a lower-surface electrode. The transistor portion 70 and the first diode portion 80 formed in the semiconductor substrate 10 are connected to the emitter electrode 52 and the collector electrode 58.

The insulating film 26 is silicate glass to which impurities are added such as boron, phosphorus or the like. The insulating film 26 is selectively formed on the upper surface 21 of the semiconductor substrate 10. The emitter electrode 52 is provided above the upper surface of the semiconductor substrate 10. The insulating film 26 is provided between the emitter electrode 52 and the semiconductor substrate 10. The emitter electrode 52 is in contact with the semiconductor substrate 10 via contact holes 54, 56 provided at the insulating film 26. The collector electrode 58 is provided on the lower surface 23 of the semiconductor substrate 10. The collector electrode 58 may be provided in contact with the lower surface 23 of the semiconductor substrate 10. The collector electrode 58 may be provided across the entire lower surface 23 of the semiconductor substrate 10.

The semiconductor substrate 10 may be a silicon substrate, may be a silicon carbide substrate and may be a nitride semiconductor substrate such as gallium nitride or the like. The semiconductor substrate 10 in the present example is a silicon substrate.

A drift region 18 of N− type is provided inside the semiconductor substrate 10. A source region 12 of N+ type having a higher doping concentration than the drift region 18 is provided between the drift region 18 and the upper surface 21 of the semiconductor substrate 10 in the cross section. A base region 14 of P− type is provided between the source region 12 and the drift region 18 in the cross section. The drift region 18 in the cross section is a residual region in the semiconductor substrate 10, in which the source region 12, the base region 14, a buffer region 20, a collector region 22 and a cathode region 82 are not formed.

The base region 14 may be formed by implanting impurities of P type such as boron from the upper surface of the semiconductor substrate 10. The source region 12 may be formed by implanting impurities of N type such as phosphorus and arsenic from the upper surface of the semiconductor substrate 10.

Each gate trench portion 40 is formed from the upper surface 21 of the semiconductor substrate 10 to the inside of the semiconductor substrate 10 and is in contact with the source region 12 and the base region 14 at the side walls. The gate trench portion 40 in the present example is provided to penetrate the source region 12 and the base region 14 from the upper surface 21 of the semiconductor substrate 10.

Each dummy trench portion 30 is formed from the upper surface 21 of the semiconductor substrate 10 to the inside of the semiconductor substrate 10 and is in contact with the base region 14 at the side walls. The side wall of the side walls of the dummy trench portion 30 that faces the gate trench portion 40 may be in contact with the source region 12 and the base region 14.

The buffer region 20 is formed on the lower-surface side of the drift region 18. The doping concentration of the buffer region 20 is higher than the doping concentration of the drift region 18. The buffer region 20 may serve as a field stop layer to prevent the depletion layer extending from the lower-surface side of the base region 14 from reaching the P+-type collector region 22.

In the transistor portion 70, formed on the lower-surface side of the buffer region 20 is the P+-type collector region 22. In the first diode portion 80, an N+-type cathode region 82 is formed on the lower-surface side of the buffer region 20.

The gate trench portion 40 has a gate insulating film 42 and a gate conductive portion 44. The gate insulating film 42 is formed to cover the interior wall of the gate trench. The gate insulating film 42 may be formed by oxidizing or nitriding a semiconductor at the interior wall of the gate trench. The gate conductive portion 44 is covered by the gate insulating film 42 inside the gate trench. In other words, the gate insulating film 42 insulates the gate conductive portion 44 from the semiconductor substrate 10. The gate conductive portion 44 is formed of a conductive material such as polysilicon.

The gate conductive portion 44 includes a region facing at least a neighboring base region 14, having the gate insulating film 42 therebetween. In the cross section, the gate trench portion 40 is covered by the insulating film 26 on the upper surface of the semiconductor substrate 10. When a prescribed voltage is applied to the gate conductive portion 44, a channel due to an electron inversion layer is formed at a surface layer of the interface of the base region 14 that contacts the gate trench portion 40.

The dummy trench portion 30 in the present example has a dummy insulating film 32 and a dummy conductive portion 34. The dummy insulating film 32 is formed to cover the interior wall of the dummy trench. The dummy conductive portion 34 is formed inside the dummy trench portion 30 and covered by the dummy insulating film 32. The dummy insulating film 32 insulates the dummy conductive portion 34 from the semiconductor substrate 10. The dummy conductive portion 34 may be formed of the same material as the gate conductive portion 44. In the cross section, the dummy trench portion 30 is covered by the insulating film 26 on the upper surface of the semiconductor substrate 10.

Providing the dummy trench portion 30 can increase the carrier accumulation effect to enhance the conductivity modulation and lower the ON voltage. Also, adjusting the ratio of dummy trench portions 30 to gate trench portions 40 can adjust the switching speed of the semiconductor device 100.

Figure 4:
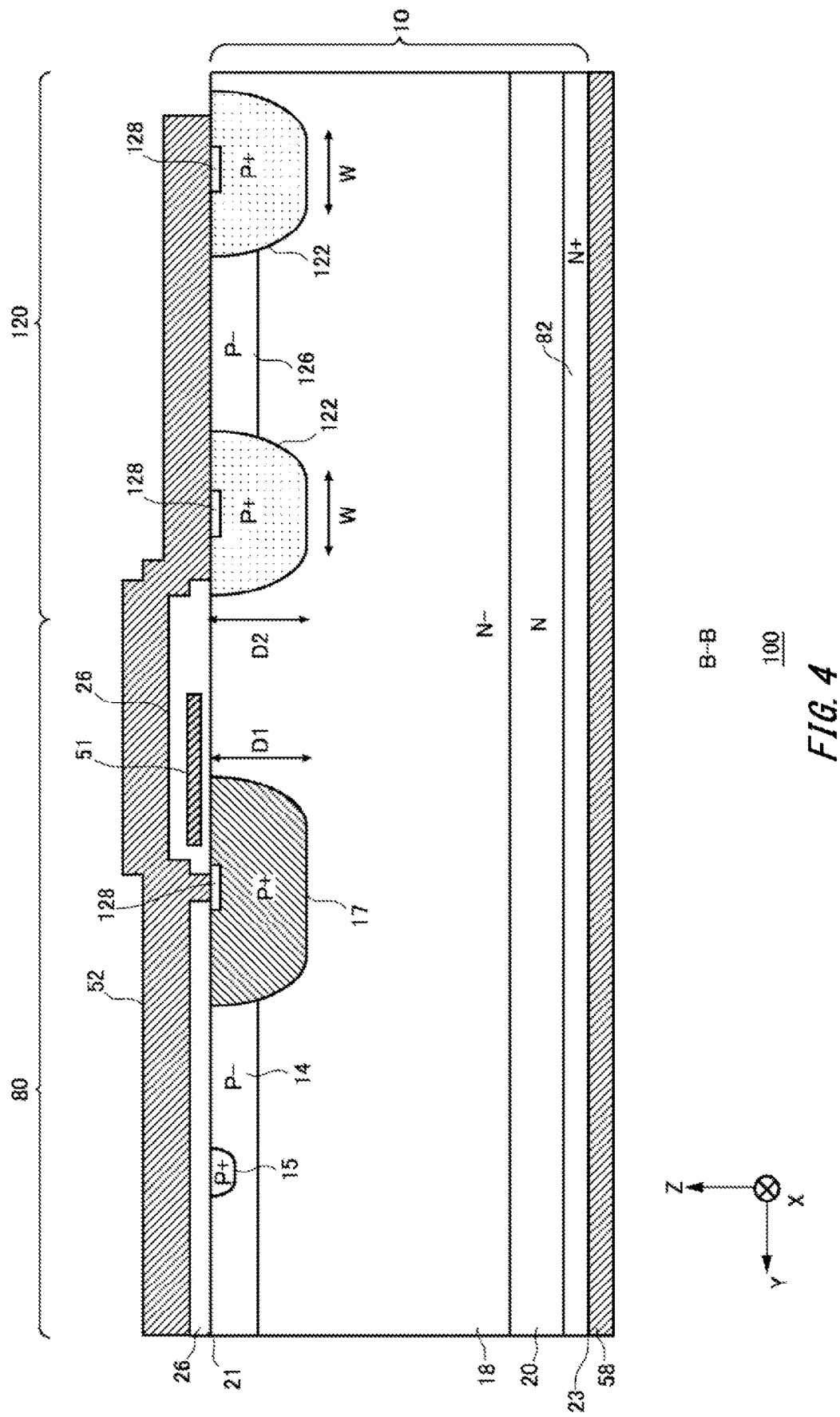
FIG. 4 is a diagram illustrating one example of a cross section taken along B-B in FIG. 2.

FIG. 4 is a diagram illustrating one example of a cross section taken along B-B in FIG. 2. The cross section taken along B-B in the present example is a cross section parallel to the YZ plane that crosses the whole of the second diode portion 120 and a part of the first diode portion 80.

The emitter electrode 52 is arranged above the both of the first diode portion 80 and the second diode portion 120. The emitter electrode 52 may arranged to extend across both of the first diode portion 80 and the second diode portion 120, passing above the gate runner portion 51. Note that the emitter electrode 52 is not provided in the region in which the gate metal layer is provided above the gate runner portion 51.

The insulating film 26 is provided between the emitter electrode 52 and the semiconductor substrate 10. Contact holes 54, 56 are formed in the insulating film 26, and the emitter electrode 52 is in contact with the semiconductor substrate 10 via the contact holes 54, 56. In the cross section, the emitter electrode 52 is in contact with the first well region 17. In the FIG. 2, the emitter electrode 52 is in contact also with the base region 14 and the contact region 15 in the region in which the contact holes 54 are provided. An ohmic region 128 of P type having a higher concentration than the first well region 17 may be provided in a region of the first well region 17 that is in contact with the emitter electrode 52. The Ohmic region 128 may be provided also in the second well region 122 described below.

As shown in FIG. 2, the first well region 17 is provided to surround the edge parts 43 of the gate trench portions 40 in the XY plane. Also, the first well region 17 may be provided to surround the edge part 43 of the gate trench portion 40 also in the YZ plane. The first well region 17 is formed to extend deeper than the edge part 43 of the gate trench portion 40 in the Z-axis direction.

A base region 14 is formed on the inner side (in the present example, the positive side of the Y-axis) of the first well region 17. The base region 14 in the first diode portion 80 serves as an anode region. In the cross section, a contact region 15 is selectively provided on the upper surface of the base region 14. Note that the first diode portion 80 may not be provided with the contact region 15.

In the second diode portion 120, the emitter electrode 52 is electrically connected to the second well region 122 and the anode region 126. The anode region 126 is provided between the upper surface 21 of the semiconductor substrate 10 and the drift region 18.

In the first diode portion 80 and the second diode portion 120, a cathode region 82 which is exposed on the lower surface 23 of the semiconductor substrate 10 is provided. The cathode region 82 in the second diode portion 120 may have the same doping concentration and is provided at the same depth position as the cathode region 82 in the first diode portion 80. The cathode region 82 in the first diode portion 80 and the second diode portion 120 is electrically connected to the common collector electrode 58.

The area of the first diode portion 80 may refer to the area in the XY plane of the region in which the base region 14 is provided to be exposed on the upper surface 21 of the semiconductor substrate 10 and the cathode region 82 is provided to be exposed on the lower surface 23 of the semiconductor substrate 10. Also, the area of the second diode portion 120 may refer to the area in the XY plane of the region in which the anode region 126 is provided to be exposed on the upper surface 21 of the semiconductor substrate 10 and the cathode region 82 is provided to be exposed on the lower surface 23 of the semiconductor substrate 10.

The first diode portion 80 and the second diode portion 120 can be caused to have different resistivities by making the doping concentration of the anode region 126 in the second diode portion 120 different from the doping concentration of the base region 14 (anode region) in the first diode portion 80. Since the carrier injection amount is increased, for example by making the doping concentration higher, the resistivity can be reduced.

The doping concentration of the anode region 126 in the second diode portion 120 may be higher than the doping concentration of the base region 14 (anode region) in the first diode portion 80. In the drawings attached to this specification, although the doping concentrations of the anode region 126 and the base region 14 are both shown as P−, the anode region 126 and the base region 14 may have different doping concentrations. In this case, the resistivity of the second diode portion 120 may become lower than the resistivity of the first diode portion 80. The doping concentration of the anode region 126 in the second diode portion 120 may be lower than the doping concentration of the base region 14 (anode region) in the first diode portion 80. In this case, the resistivity of the second diode portion 120 may become higher than the resistivity of the first diode portion 80.

The difference between the doping concentration of the anode region 126 in the second diode portion 120 and the doping concentration of the base region 14 (anode region) in the first diode portion 80 may be between 10% and 200%, inclusive, of the doping concentration of the anode region 126 in the second diode portion 120.

Also, the movement of carriers between the first diode portion 80 and the transistor portion 70 and the second diode portion 120 can be suppressed by providing the second well region 122 such that it surrounds the anode region 126 of the second diode portion 120. In other words, the second diode portion 120 is separated from the first diode portion 80 and the transistor portion 70 by the second well region 122. The second well region 122 is provided from the upper surface 21 of the semiconductor substrate 10 to the inside of the semiconductor substrate 10.

Note that the breakdown voltage of the second diode portion 120 can be adjusted by setting the doping concentration, the depth D2 and the width W of the second well region 122. For example, the doping concentration of the second well region 122 and the like may be set to make the breakdown voltage of the second diode portion 120 slightly higher than the breakdown voltage of the transistor portion 70. This can prevent breakdown from occurring in the second diode portion 120 earlier than in the transistor portion 70 and suppress the current concentration to the second diode portion 120 having relatively small area. The second diode portion 120 may have a third well region and a fourth well region on the outer side of the second well region 122.

Since the second diode portion 120 and the transistor portion 70 are formed on the same semiconductor substrate 10, they have almost the same breakdown voltages. In contrast, the breakdown voltage of the second diode portion 120 can be improved by providing the second well region 122. The larger the distance from the second well region 122 to the first well region 17 is, the more the breakdown voltage is improved.

Also, the depth of the second well region 122, D2 may be larger than or the same as the depth of the first well region 17, D1. The depth of each region refers to the distance from the upper surface 21 of the semiconductor substrate 10 to the lowest end of each region in the Z-axis direction.

A flow of carriers from the main element portion 110 to the anode region 126 can be suppressed by forming the second well region 122 deeply. This can better separate the main element portion 110 from the second diode portion 120.

Also, the doping concentration of the second well region 122 may be the same as, lower than, or higher than the doping concentration of the first well region 17. The effect of the operation of the main element portion 110 on the operation of the second diode portion 120 can be reduced by making the doping concentration of the second well region 122 higher.

Also, the doping concentration of the second well region 122 is higher than the doping concentration of the anode region 126. As an example, the doping concentration of the second well region 122 is between $1.0 \times 10^{13}/\text{cm}^3$ and $1.0 \times 10^{17}/\text{cm}^3$, inclusive. As an example, the doping concentrations of the anode region 126 and the base region 14 are between $1.0 \times 10^{13}/\text{cm}^3$ and $1.0 \times 10^{16}/\text{cm}^3$, inclusive.

Figure 5:
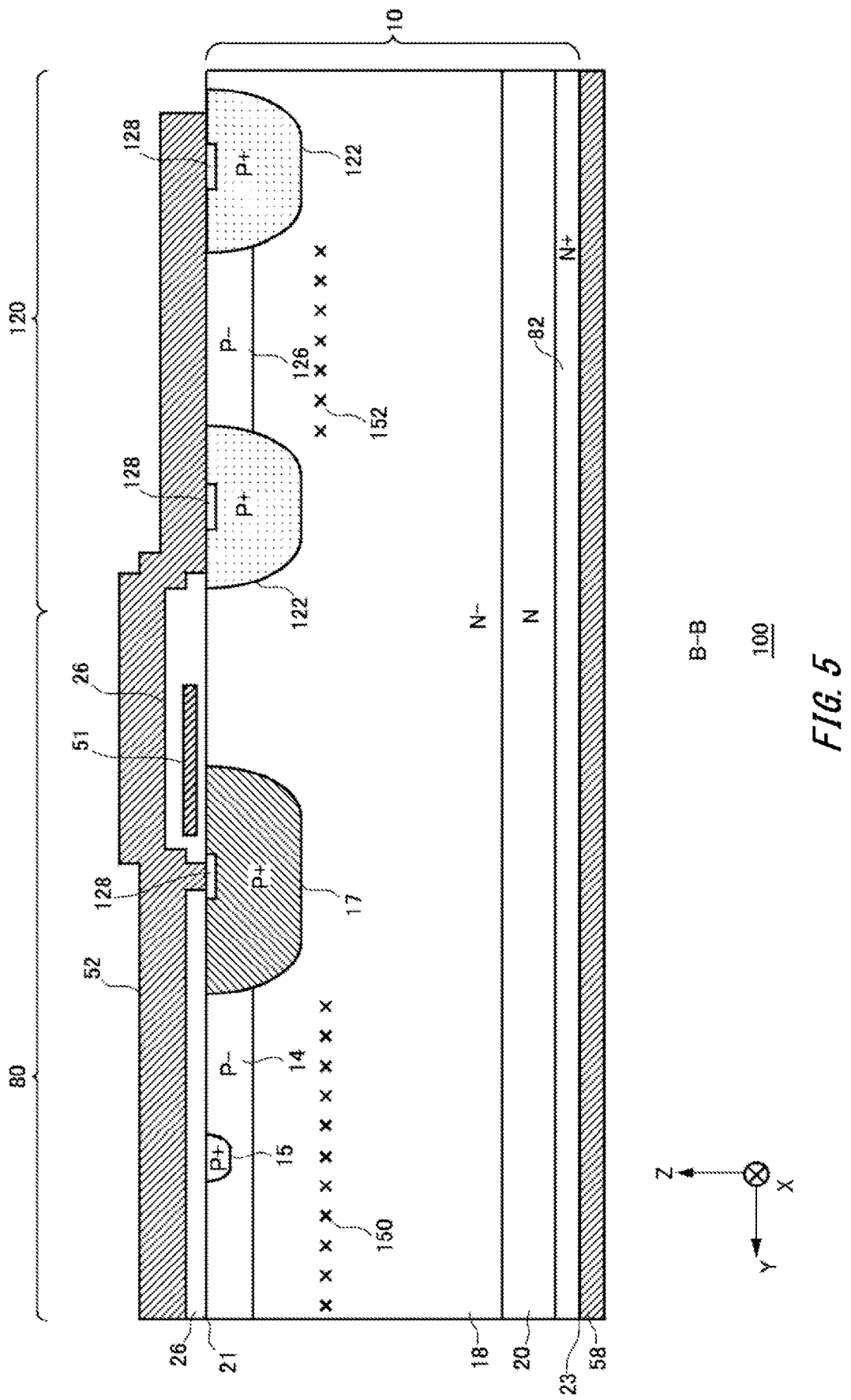
FIG. 5 is a diagram illustrating another example of the cross section taken along B-B in FIG. 2.

FIG. 5 is a diagram illustrating another example of the cross section taken along B-B in FIG. 2. Compared to the structure shown in FIG. 4, the semiconductor device 100 in the present example further includes lifetime killers 150 provided in the first diode portion 80 and lifetime killers 152 provided in the second diode portion 120. The other parts of the structure may be the same as those shown in FIG. 4. Note that the doping concentrations of the anode region 126 and the base region 14 in the example of FIG. 5 may be different from each other as with the example of FIG. 4, or they may be the same.

The lifetime killers 150 and the lifetime killers 152 are provided inside the semiconductor substrate 10 and control the lifetimes of carriers. The lifetime killers 150 and 152 may be crystal defects formed by irradiating the semiconductor substrate 10 with helium ions, protons, electron beam or the like. The lifetime killers 150 and 152 in the present example are provided on the upper-surface side of the semiconductor substrate 10. The upper-surface side of the semiconductor substrate 10 refers to the region above the center of the semiconductor substrate 10 in the depth direction. The lifetime killers 150 and 152 may be provided at a position deeper than the lower ends of the base region 14 and the anode region 126 when seen from the upper surface 21 of the semiconductor substrate 10. The lifetime killers 150 and 152 may be provided a position deeper than the lower end of the first well region 17 or may be provided a position deeper than the lower end of the second well region 122.

In the present example, the concentration of the lifetime killers 150 is different from that of the lifetime killers 152. Adjustment of the concentrations of the lifetime killers 150 and 152 can adjust the frequency of carrier recombination due to crystal defect and adjust the lifetimes of carriers. The concentration per unit volume of the lifetime killers 150 may be different from that of the lifetime killers 152. In other words, the lifetime killers 150 and 152 may be different in crystal defect density per unit volume. Since the carrier lifetime can be adjusted by adjusting the concentration of the lifetime killers, the resistivity of a diode portion can be adjusted. For example, since the carrier lifetime becomes shorter by making the concentration of the lifetime killers higher, the resistivity can be increased.

The concentration of the lifetime killers 152 in the second diode portion 120 may be higher than the concentration of the lifetime killers 150 in the first diode portion 80. In this case, the resistivity of the second diode portion 120 may become higher than the resistivity of the first diode portion 80. The concentration of the lifetime killers 152 in the second diode portion 120 may be lower than the concentration of the lifetime killers 150 in the first diode portion 80. In this case, the resistivity of the second diode portion 120 may become lower than the resistivity of the first diode portion 80.

The difference between the concentration of the lifetime killers 152 in the second diode portion 120 and the concentration of the lifetime killers 150 in the first diode portion 80 may be between 10% and 200%, inclusive, of the higher one of the two concentrations. Note that the lifetime killers 150 or the lifetime killers 152 but not both may be provided.

Figure 6:
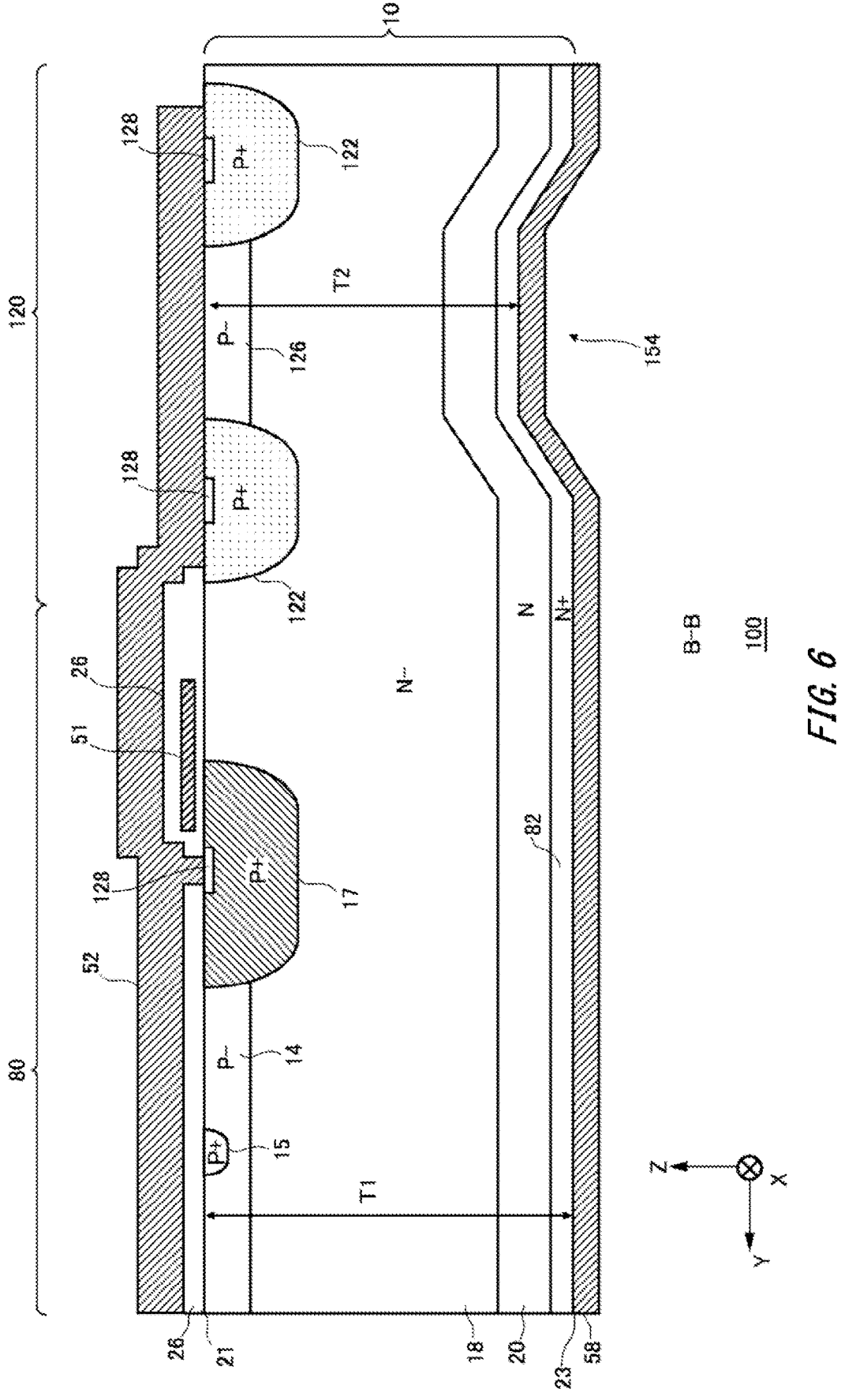
FIG. 6 is a diagram illustrating yet another example of the cross section taken along B-B in FIG. 2.

FIG. 6 is a diagram illustrating yet another example of the cross section taken along B-B in FIG. 2. For the semiconductor device 100 in the present example, the thickness of the semiconductor substrate 10 in the first diode portion 80, T1 is different from the thickness of the semiconductor substrate 10 in the second diode portion 120, T2. The thickness of the semiconductor substrate 10 refers to the distance from the upper surface 21 to the lower surface 23 in the Z-axis direction. The parts of the structure other than the thickness of the semiconductor substrate 10 may be the same as those shown in FIG. 4 or FIG. 5. Note that the doping concentrations of the anode region 126 and the base region 14 in the example of FIG. 6 may be different from each other as with the example of FIG. 4, and they may be the same.

As the thickness of the semiconductor substrate 10, T1, the minimum value of the thickness of the semiconductor substrate 10 in a region in which the base region 14 and the cathode region 82 are provided may be used. As the thickness of the semiconductor substrate 10, T2, the minimum value of the thickness of the semiconductor substrate 10 in a region in which the anode region 126 and the cathode region 82 are provided may be used. In the region in which the thickness of the semiconductor substrate 10 is small, a recessed portion 154 is provided on the lower surface 23 of the semiconductor substrate 10. The collector electrode 58 is provided to fit along the recessed portion 154.

The first diode portion 80 and the second diode portion 120 may have different thicknesses of the drift region 18. The thickness of the base region 14 may be the same as the thickness of the anode region 126. Also, the first diode portion 80 and the second diode portion 120 may have the same thicknesses of the buffer region 20 and the cathode region 82.

The resistivities of the first diode portion 80 and the second diode portion 120 can be made different from each other by making the thicknesses of the semiconductor substrate 10 in the two portions different. For example, the resistivity of a diode portion can be made low by reducing the thickness of the semiconductor substrate 10.

The thickness of the semiconductor substrate 10 in the second diode portion 120, T2 may be greater than the thickness of the semiconductor substrate 10 in the first diode portion 80, T1. In this case, the resistivity of the second diode portion 120 may become higher than the resistivity of the first diode portion 80. The thickness of the semiconductor substrate 10 in the second diode portion 120, T2 may be smaller than the thickness of the semiconductor substrate 10 in the first diode portion 80, T1. In this case, the resistivity of the second diode portion 120 may become lower than the resistivity of the first diode portion 80. The difference between the thickness of the semiconductor substrate 10 in the second diode portion 120, T2 and the thickness of the semiconductor substrate 10 in the first diode portion 80, T1 may be between 10% and 30%, inclusive, of the thickness T2.

Figure 7:
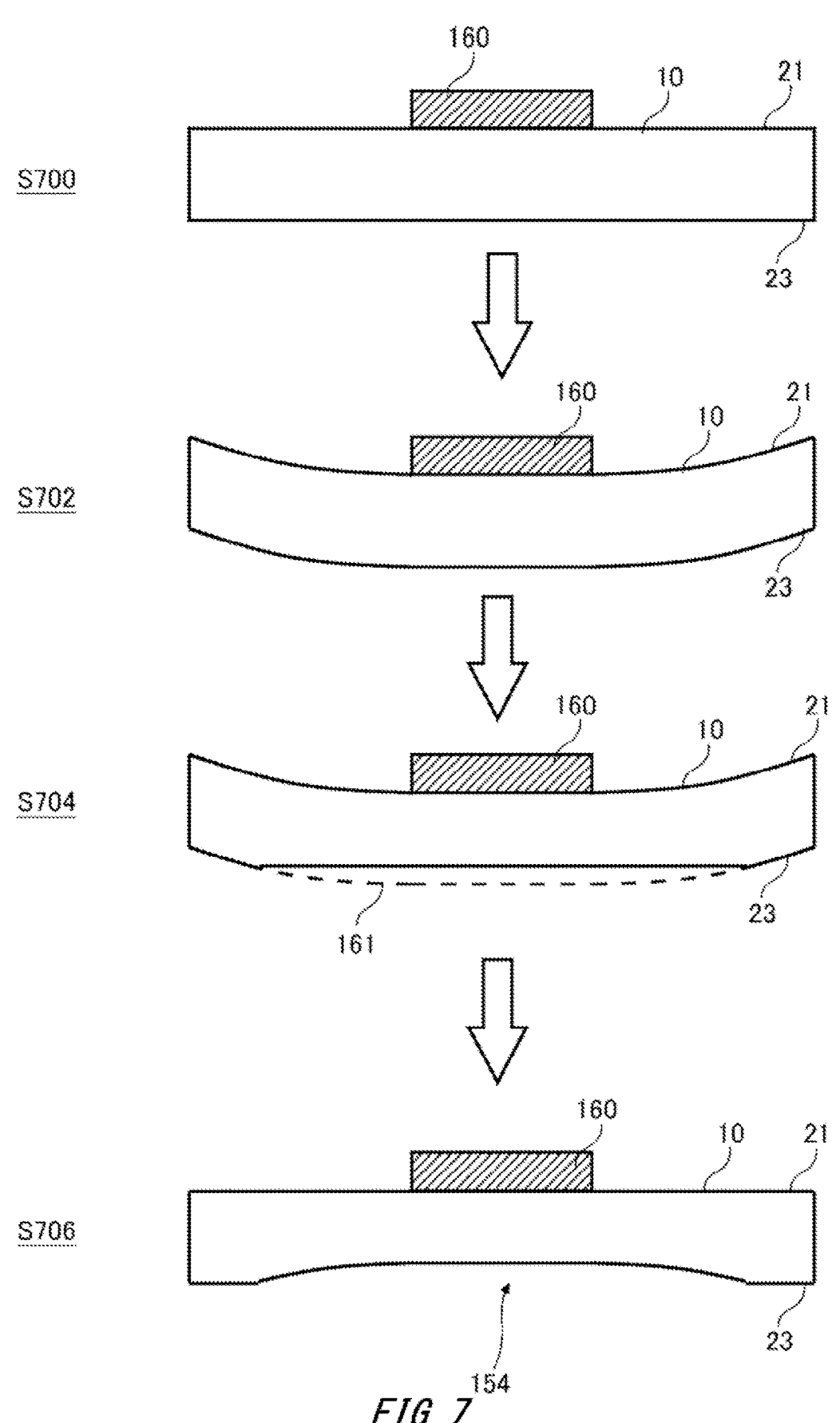
FIG. 7 is a diagram illustrating one example of a formation process of a recessed portion 154.

FIG. 7 is a diagram illustrating one example of a formation process of a recessed portion 154. When the recessed portion 154 is formed on the lower surface 23 of the semiconductor substrate 10, a sacrificial layer 160 with a prescribed pattern is formed on the upper surface 21 of the semiconductor substrate 10 (S700). The sacrificial layer 160 may be silicate glass or the like, may be resin or the like, or may be formed of other materials. The sacrificial layer 160 is provided at a position facing the region in which the recessed portion 154 should be formed.

Then, the semiconductor substrate 10 is bent so that the ends of the upper surface 21 of the semiconductor substrate 10 are displaced upward (S702). In S702, by for example, arranging, on the side of the upper surface 21 of the semiconductor substrate 10, a member which specifies the reference plane, the upper surface 21 of the semiconductor substrate 10 may be suctioned or the lower surface 23 of the semiconductor substrate 10 may be pressed. This causes the entire semiconductor substrate 10 to be bent to a degree that the ends of the upper surface 21 of the semiconductor substrate 10 are at the height position that is the same as the upper surface of the sacrificial layer 160. This results in the region of the lower surface 23 of the semiconductor substrate 10 that faces the sacrificial layer 160 protruding downward.

Then, the side of the lower surface 23 of the semiconductor substrate 10 is ground with a method such as CMP (S704). In FIG. 7, a ground portion 161 is shown with dashed line. Thus, the region of the lower surface 23 that faces the sacrificial layer 160 is ground.

Then, the pressing or suctioning on the semiconductor substrate 10 is released to remove the deflection of the semiconductor substrate 10 (S706). In this way, the recessed portion 154 in the region of the lower surface 23 that faces the sacrificial layer 160 can be formed. After this, the sacrificial layer 160 is removed. Also, after the sacrificial layer 160 is removed, respective regions inside the semiconductor substrate 10 may be formed by implanting impurities into the inside of the semiconductor substrate 10.

Figure 8:
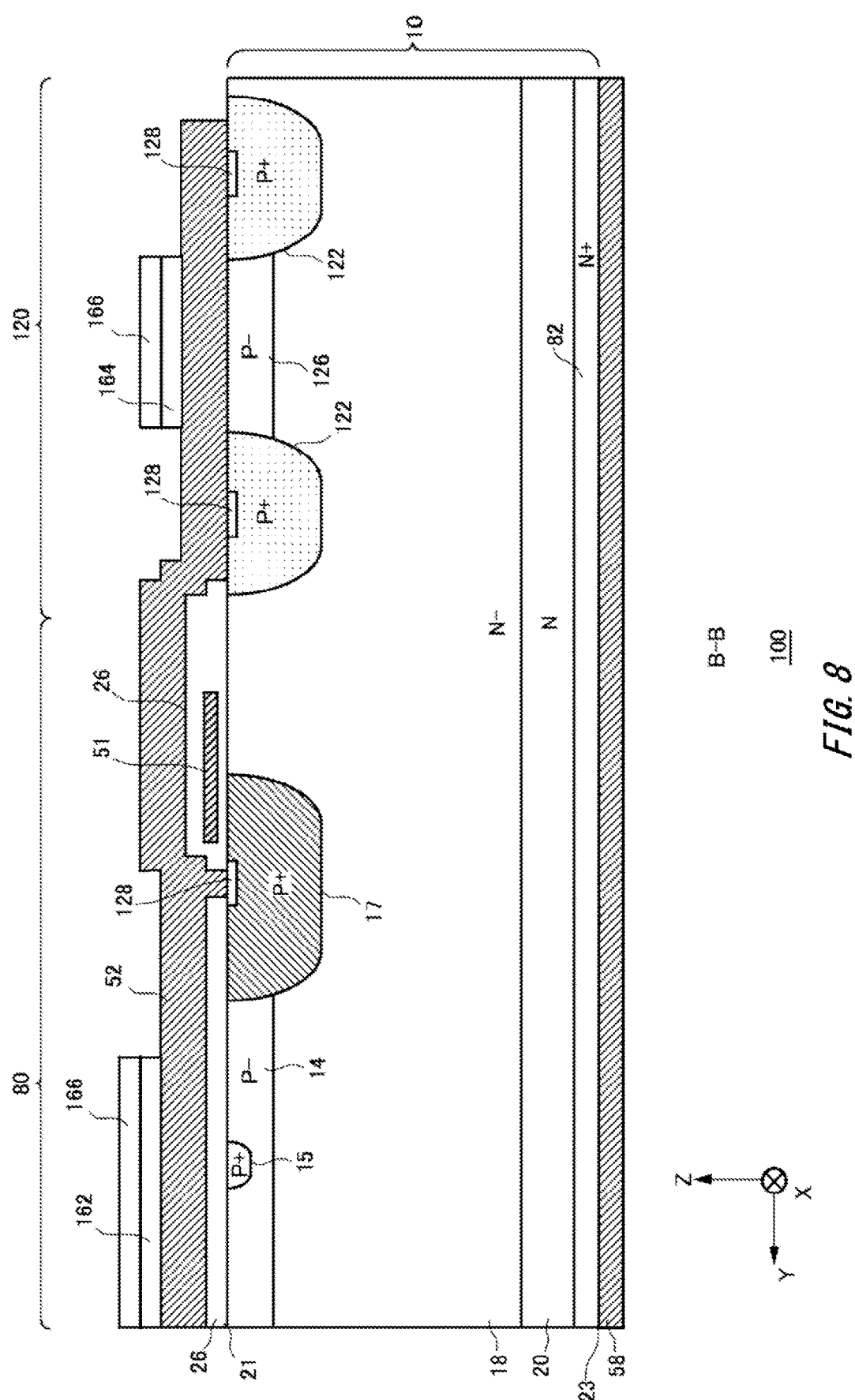
FIG. 8 is a diagram illustrating another example of the cross section taken along B-B in FIG. 2.

FIG. 8 is a diagram illustrating another example of the cross section taken along B-B in FIG. 2. For the semiconductor device 100 in the present example, resistance portions (in FIG. 8, a first resistance portion 162 and a second resistance portion 164) connected to the emitter electrode 52 are provided in at least one of the first diode portion 80 and the second diode portion 120. The other parts of the structure may be the same as those shown in FIG. 4 to FIG. 6. Note that the doping concentrations of the anode region 126 and the base region 14 in the example of FIG. 8 may be different from each other as with the example of FIG. 4, or they may be the same.

The first resistance portion 162 is provided on the region in the emitter electrode 52 to which the first diode portion 80 is connected. At least a part of the first resistance portion 162 is arranged above the base region 14. The second resistance portion 164 is provided on the region in the emitter electrode 52 to which the second diode portion 120 is connected. At least a part of the second resistance portion 164 is arranged above the anode region 126.

The first resistance portion 162 and the second resistance portion 164 may be formed of polysilicon or may be formed of other materials. The first resistance portion 162 in the first diode portion 80 and the second resistance portion 164 in the second diode portion 120 have different resistance values in the Z-axis direction. The resistance value of each resistance portion can be adjusted by for example, a concentration of impurities doped into polysilicon, thickness in the Z-axis direction, an area in the XY plane or the like. Independent pad 166 may be provided on the top of each of the first resistance portion 162 and the second resistance portion 164. The pad 166 may be electrically connected to an apparatus different from the semiconductor device 100 via a wire or the like.

The resistance value of the second resistance portion 164 in the second diode portion 120 may be higher than the resistance value of the first resistance portion 162 in the first diode portion 80. In this case, the resistance to the current flowing through the second diode portion 120 may become higher than the resistance to the current flowing through the first diode portion 80. The resistance value of the second resistance portion 164 in the second diode portion 120 may be lower than the resistance value of the first resistance portion 162 in the first diode portion 80. In this case, the resistance to the current flowing through the second diode portion 120 may become lower than the resistance to the current flowing through the first diode portion 80. The difference between the resistance values of the second resistance portion 164 and the first resistance portion 162 may be between 10% and 200%, inclusive, of the higher one of the resistance values of the second resistance portion 164 and the first resistance portion 162.

Note that two or more of the configuration in which the doping concentrations of the base region 14 and the anode region 126 are different from each other as described in FIG. 4, the configuration in which the concentrations of the lifetime killers of the regions are different from each other as described in FIG. 5, the configuration in which the thicknesses of the semiconductor substrate 10 of the regions are different from each other as described in FIG. 6 and the configuration in which the resistance values of the resistance portions at the regions are different from each other as described in FIG. 8 may be combined.

Figure 9:
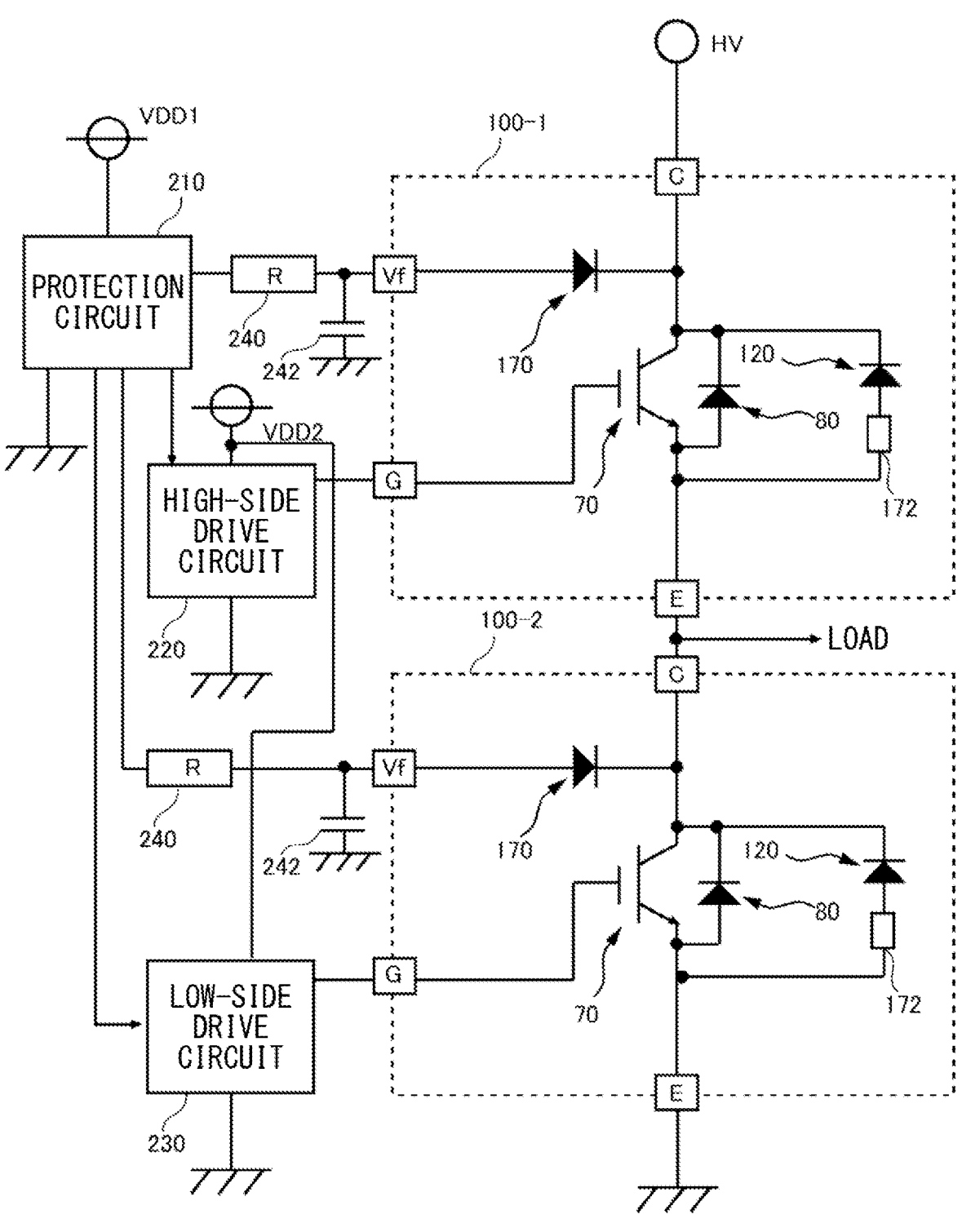
FIG. 9 is a diagram illustrating one example of an output apparatus 200 including the semiconductor device 100.

FIG. 9 is a diagram illustrating one example of an output apparatus 200 including the semiconductor device 100. The output apparatus 200 in the present example includes a semiconductor device 100-1 and a semiconductor device 100-2, a protection circuit 210, a high-side drive circuit 220 and a low-side drive circuit 230.

Each semiconductor device 100 includes a collector terminal C, an emitter terminal E, a gate terminal G and a sense terminal Vf. The collector terminal C is electrically connected to the collector electrode 58, the emitter terminal E is electrically connected to the emitter electrode 52, the gate terminal G is electrically connect to the gate conductive portion 44 in the gate trench portion 40 and the sense terminal Vf is electrically connected to a sensing electrode provided separately from the emitter electrode 52.

A prescribed high voltage HV is applied to the collector terminal C of the semiconductor device 100-1. The emitter terminal E of the semiconductor device 100-1 is connected to the collector terminal C of the semiconductor device 100-2. A prescribed reference voltage (in the present example, the ground voltage) is applied to the emitter terminal E of the semiconductor device 100-2. The emitter terminal E of the semiconductor device 100-1 is connected to a load.

The high-side drive circuit 220, which is connected to the gate terminal G of the semiconductor device 100-1, controls the semiconductor device 100-1. The low-side drive circuit 230, which is connected to the gate terminal G of the semiconductor device 100-2, controls the semiconductor device 100-2. As an example, one of the transistor portions 70 of the semiconductor device 100-1 and the semiconductor device 100-2 is controlled to be in an ON state, and the other is controlled to be in an OFF state. In this way, the prescribed voltage and current are supplied to the load.

A sense diode 170 is provided between the sense terminal Vf and the collector terminal C in each semiconductor device 100. The sense terminal Vf is provided on the upper surface 21 of the semiconductor substrate 10. Although the anode of the sense diode 170 has a structure similar to that of the first diode portion 80 or the second diode portion 120, it is connected to the sense terminal Vf instead of the emitter electrode 52.

The protection circuit 210 applies, to the sense terminal Vf, such a voltage that the sense diode 170 becomes forward bias during normal operation and the sense diode 170 becomes reverse bias if the voltage at the collector terminal C becomes the prescribed value or more. In other words, the protection circuit 210 applies, to the sense terminal Vf, a voltage greater than the collector voltage during normal operation of the sense diode 170. The protection circuit 210 may be connected to the sense terminal Vf via a resistance 240. Providing the resistance 240 can cause the current flowing through the second diode portion 120 to be very small. Also, a capacity 242 is connected in parallel on the path connecting the protection circuit 210 and the sense terminal Vf.

The second diode portion 120 is provided in parallel to the first diode portion 80 in each semiconductor device 100. Also, the difference between the resistivity of the first diode portion 80 and the resistivity of the second diode portion 120 is shown as the additional resistance 172. In the present example, the resistivity of the second diode portion 120 is higher than the resistivity of the first diode portion 80. The characteristics of the semiconductor device 100 can be adjusted by adjusting the resistivity of the second diode portion 120 having a small area.

Figure 10:
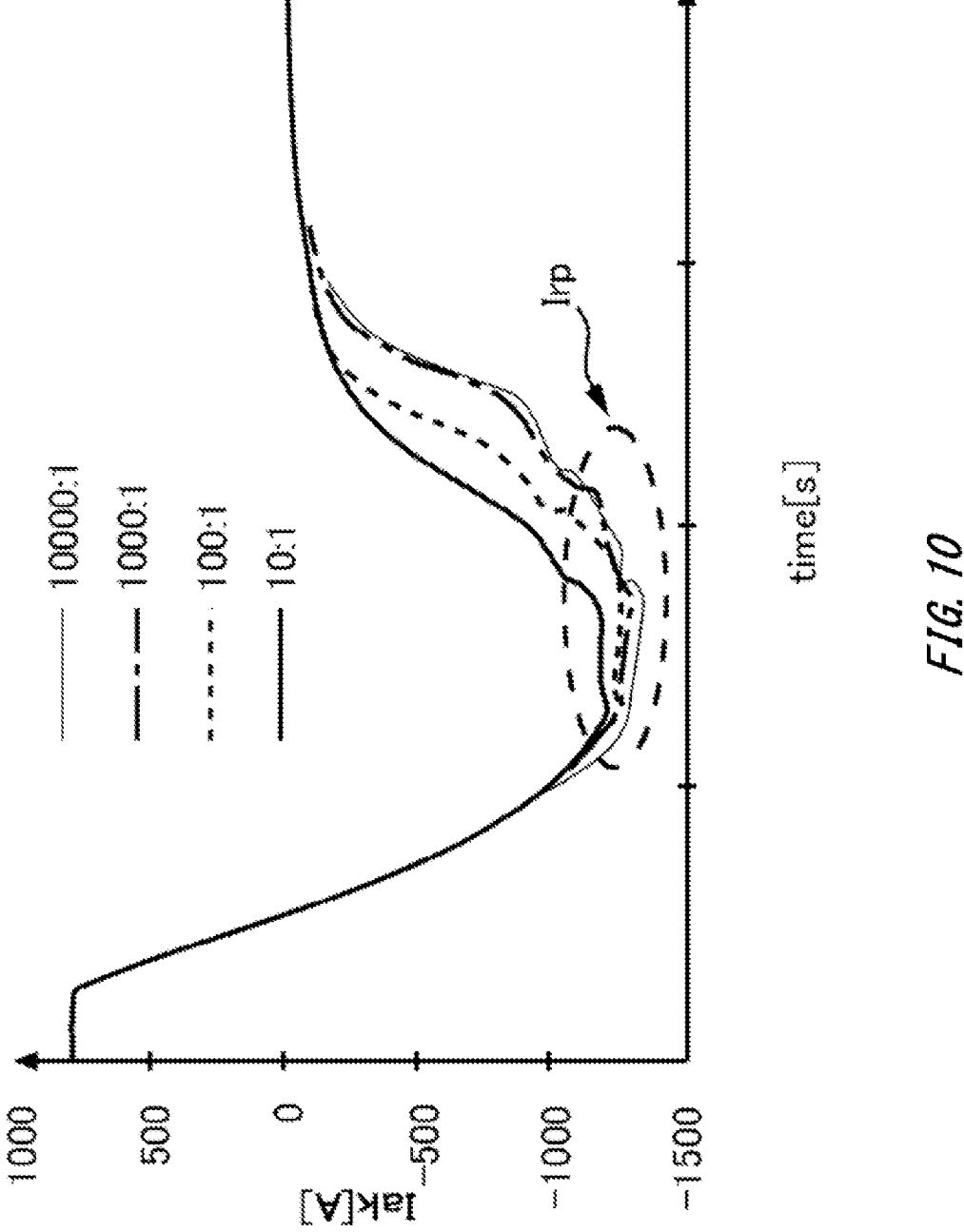
FIG. 10 a diagram illustrating one example of a current waveform during reverse recovery for the semiconductor device 100, in which a base region 14 and an anode region 126 have different doping concentrations as described in FIG. 4.
Figure 11:
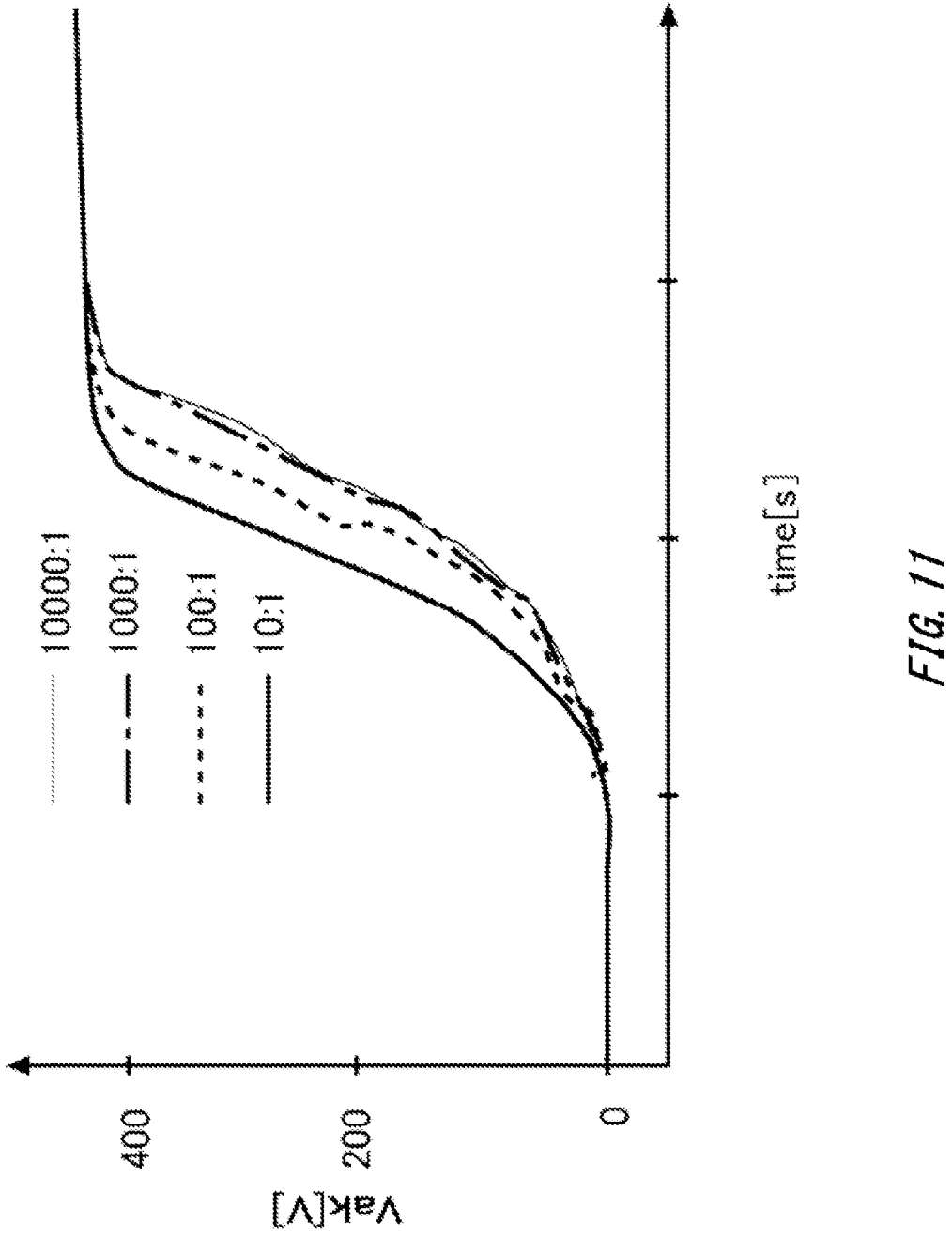
FIG. 11 shows one example of a voltage waveform during reverse recovery.

FIG. 10 a diagram illustrating one example of a current waveform during reverse recovery for the semiconductor device 100, in which a base region 14 and an anode region 126 have different doping concentrations as described in FIG. 4. FIG. 11 shows one example of a voltage waveform during reverse recovery. In the examples of FIG. 10 and FIG. 11, cases where the ratio of the total area of the first diode portions 80 to the total area of the second diode portions 120 are 10:1, 100:1, 1000:1 and 10000:1 (in every case, the total area of the first diode portions 80 is larger) are shown. Also, the doping concentration of the base region 14 is twice as high as the doping concentration of the anode region 126. Therefore, the resistivity of the second diode portion 120 having relatively small area is caused to be higher than the resistivity of the first diode portion 80.

As shown in FIG. 10 and FIG. 11, the current and voltage characteristics of the first diode portion 80 and the second diode portion 120 during reverse recovery can be adjusted by adjusting the total areas of the first diode portion 80 and the second diode portion 120. To be specific, the peak current Irp during reverse recovery can be better suppressed by increasing the total area of the second diode portions 120. Also, the rising speed of the voltage Vak between the anode and the cathode during reverse recovery can be increased by increasing the total area of the second diode portions 120.

Figure 12:
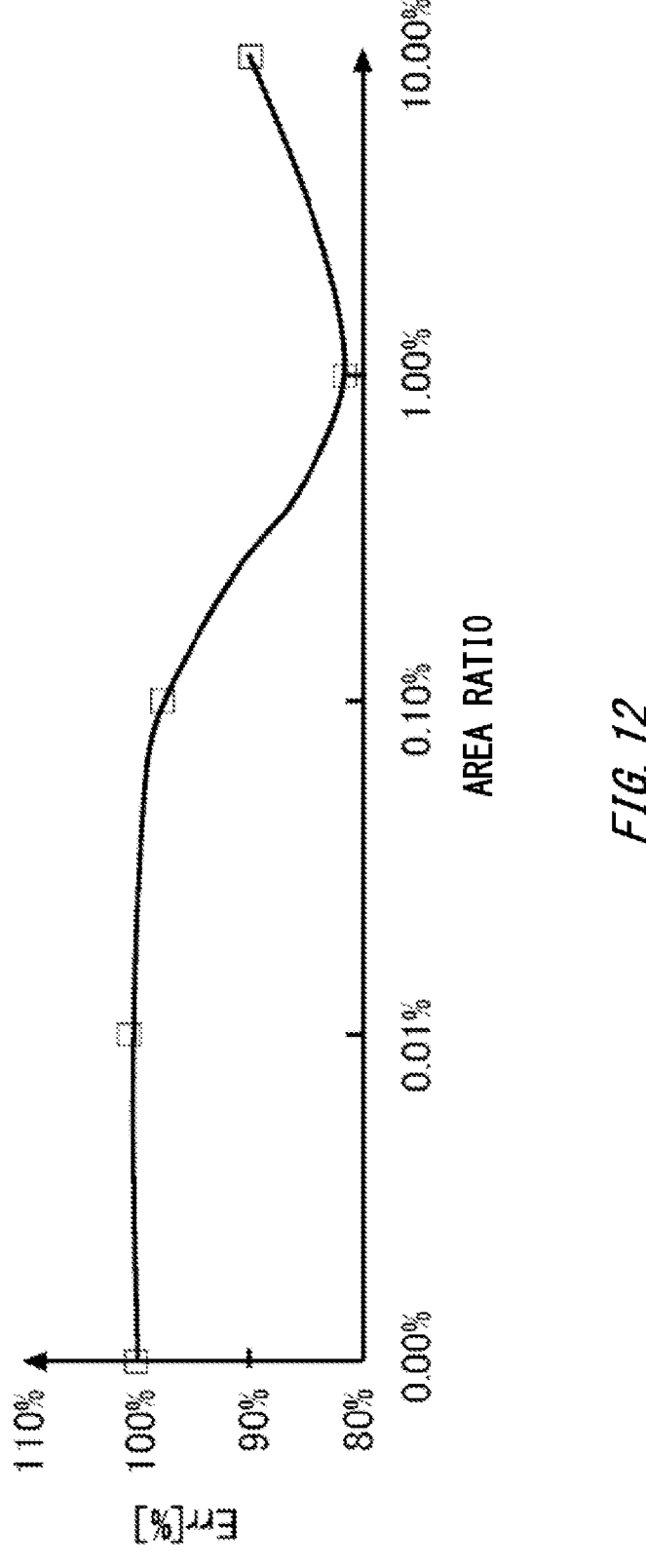
FIG. 12 shows one example of a loss Err during reverse recovery for the semiconductor device 100, in which the base region 14 and the anode region 126 have different doping concentrations as described in FIG. 4.

FIG. 12 shows one example of a loss Err during reverse recovery for the semiconductor device 100, in which the base region 14 and the anode region 126 have different doping concentrations. In the example of FIG. 12, with the ratio of the total area of the second diode portions 120 to the total area of the first diode portions 80 being the horizontal axis, reverse recovery loss Errs for 0% (the second diode portion 120 is not provided), 0.01% (10000:1), 0.1% (1000:1), 1% (100:1) and 10% (10:1) are shown.

It can be seen that as shown in FIG. 12, when the area of the second diode portion 120 becomes 0.1% of that of the first diode portion 80 or more, the reverse recovery loss Err decreases. Also, the reverse recovery loss Err is at a minimum when the area of the second diode portion 120 is around 1% of the area of the first diode portion 80.

The total area of the second diode portions 120 may be between 0.1% and 10%, inclusive, of the total area of the first diode portions 80. The total area of the second diode portions 120 may be between 0.5% and 5%, inclusive, of the total area of the first diode portions 80.

Figure 13:
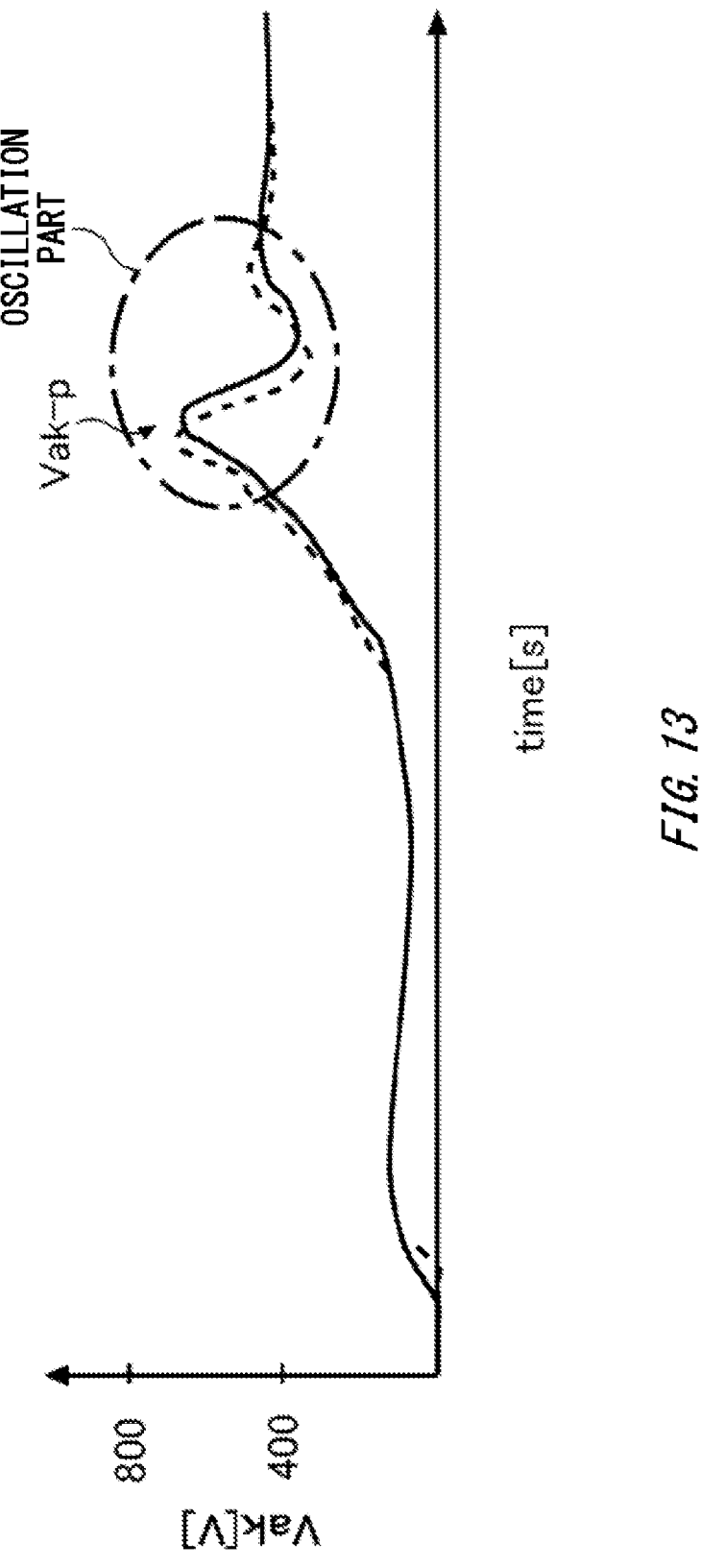
FIG. 13 shows one example of a voltage waveform during reverse recovery for the semiconductor device 100.
Figure 14:
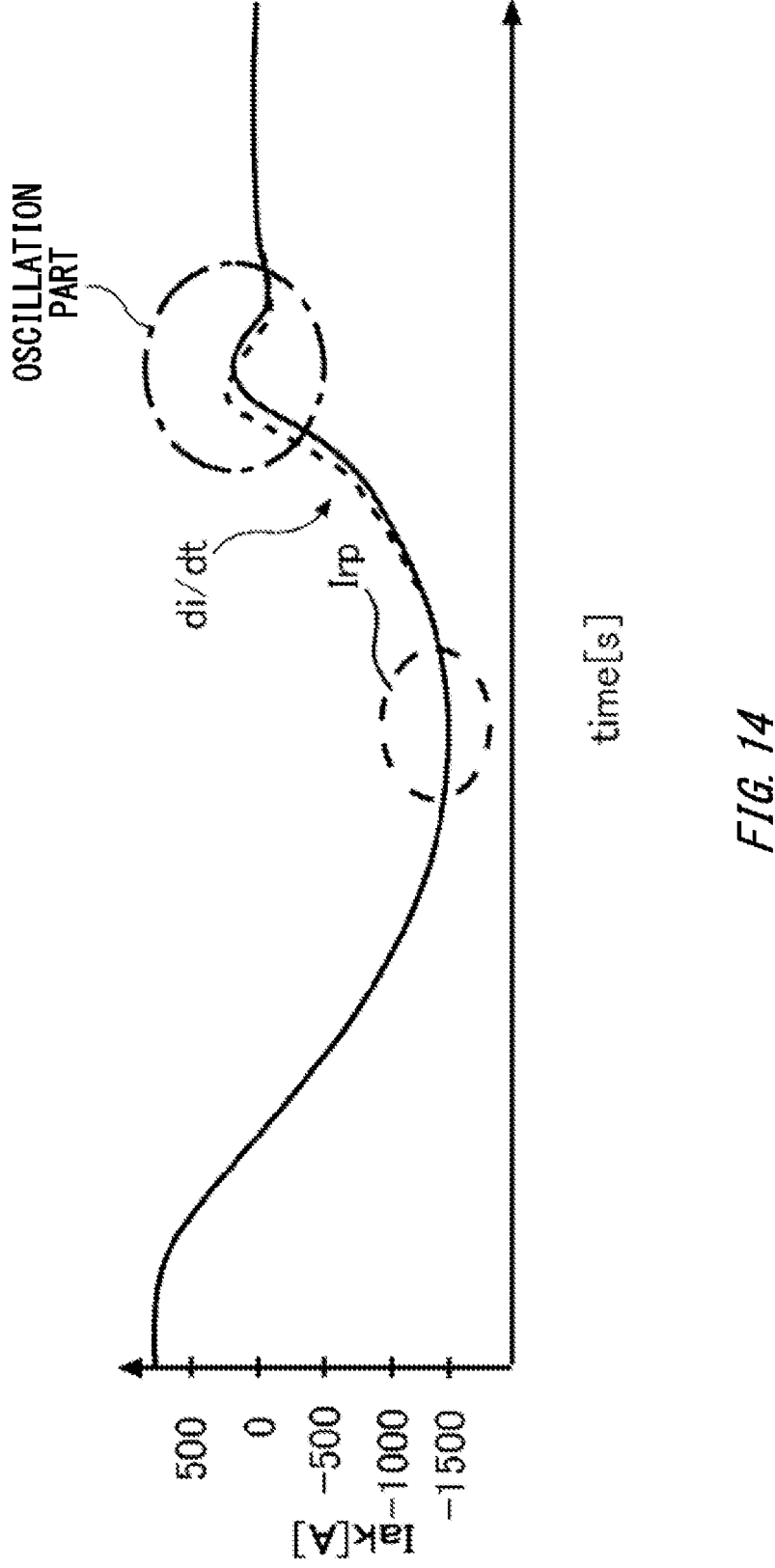
FIG. 14 shows one example of a current waveform during reverse recovery for the semiconductor device 100.

FIG. 13 shows one example of a voltage waveform during reverse recovery for the semiconductor device 100. The waveform shown in FIG. 13 includes an oscillation part generated after the voltage Vak has risen. FIG. 14 shows one example of a current waveform during reverse recovery for the semiconductor device 100. The waveform shown in FIG. 14 includes an oscillation part generated when the current Iak converges from peak current Irp to 0 A.

In FIG. 13 and FIG. 14, the example of the doping concentration of the base region 14 being twice as high as the doping concentration of the anode region 126 is shown with a solid line and the example of the doping concentration of the base region 14 being one time as high as the doping concentration of the anode region 126 is shown with a dashed line. As shown in FIG. 13 and FIG. 14, the oscillations of the voltage and the current during reverse recovery can be suppressed by increasing the doping concentration of the base region 14. Since a gate resistor of high resistance to suppress the oscillation need not be connected, the reverse recovery loss Err can be reduced.

Figure 15:
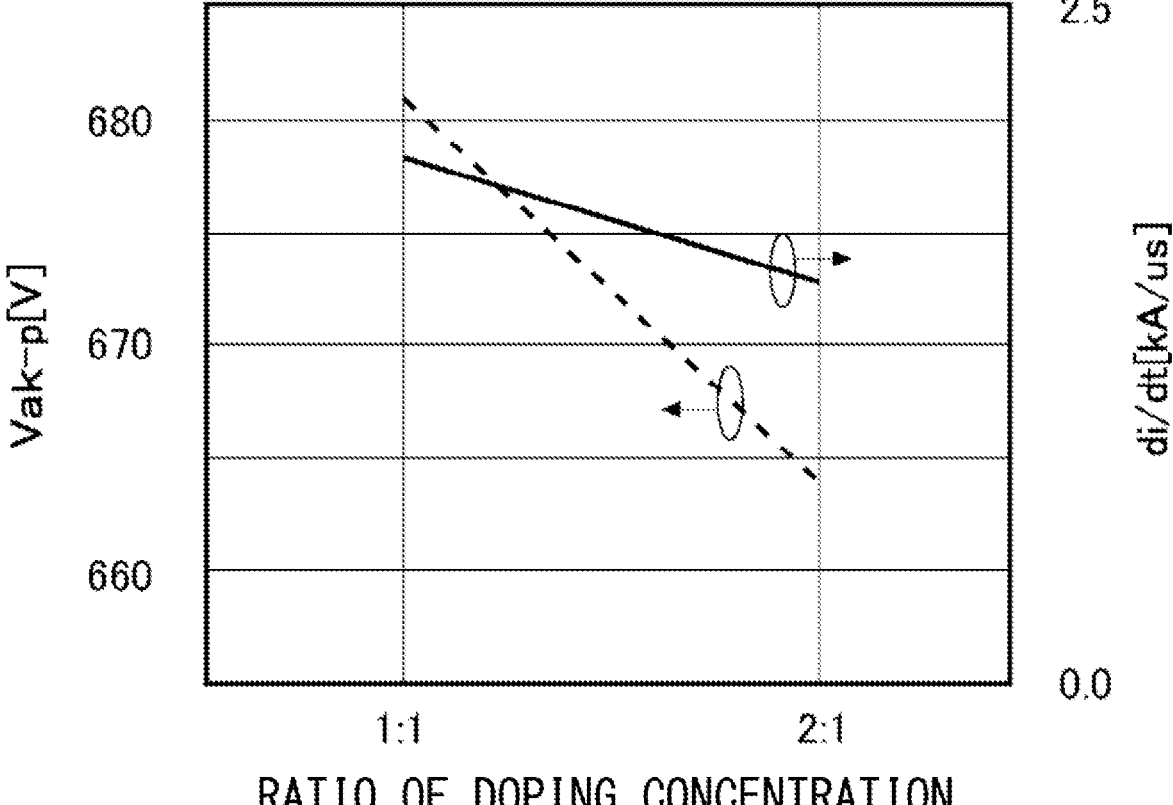
FIG. 15 shows one example of a peak voltage, Vak-p and a slope of the current waveform, di/dt during reverse recovery when the ratio of the doping concentration of the base region 14 to that of the anode region 126 is changed.

FIG. 15 shows one example of a peak voltage, Vak-p and a slope of the current waveform, di/dt during reverse recovery when the ratio of the doping concentration of the base region 14 to that of the anode region 126 is changed, that is, when the ratio of the doping concentration of the base region 14 to that of the anode region 126 is changed from 1:1 to 2:1. Note that in the present example, the total area of the first diode portions 80 is larger than the total area of the second diode portions 120. Therefore, the base region 14 is larger than the anode region 126. As shown in FIG. 13, the peak voltage Vak-p refers to the voltage at the first peak (the local maximum value) after the voltage Vak has risen. As shown in FIG. 14, the slope di/dt refers to the average value of the current change over time from when the current Iak becomes the peak current Irp to when the current Iak becomes 0 A at the first time.

In FIG. 15, circle symbols surrounding respective straight lines and arrows attached to the circle symbols point to the vertical axes corresponding to the respective straight lines. In FIG. 15, the peak voltage Vak-p is shown with a dashed line and the slope of the current waveform di/dt is shown with a solid line. As shown in FIG. 15, the peak voltage Vak-p and the slope di/dt can be reduced by increasing the doping concentration of the base region 14.

Figure 16:
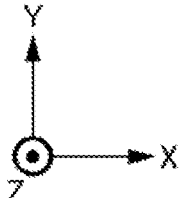
FIG. 16 shows another example of a configuration on the upper surface of the semiconductor device 100.

FIG. 16 shows another example of a configuration on the upper surface of the semiconductor device 100. In the present example, the second diode portions 120 are arranged inside the first diode portion 80 in the XY plane. Also in the present example, each second diode portion 120 is preferably separated from the first diode portion 80 by the second well region 122. In other words, the second well region 122 is provided between the base region 14 in the first diode portion 80 and the anode region 126 in the second diode portion 120.

A plurality of second diode portions 120 may be arranged in a distributed manner in the XY plane. For example, one or more second diode portions 120 may be arranged in each first diode portions 80. The variation of the characteristics of the semiconductor device 100 in the XY plane can be suppressed by arranging the second diode portions 120 in a distributed manner.

Also, the semiconductor device 100 may further include a sense diode portion 180 provided on the semiconductor substrate 10. The sense diode portion 180 detects whether a voltage at any of nodes in the main element portion 110 is within a prescribed voltage range. The sense diode portion 180 in the present example detects whether the collector voltage of the IGBT included in the transistor portion 70 is within the prescribed voltage range. For the sense diode portion 180 in the present example, the collector voltage of the IGBT is applied to the cathode terminal. Such a voltage is applied to an anode terminal of the sense diode portion 180 that the sense diode portion 180 becomes forward bias during normal operation and the sense diode portion 180 becomes reverse bias when the collector voltage of the IGBT becomes the prescribed value or more. Whether the collector voltage of the IGBT becomes the prescribed value or more can be detected based on the state of the sense diode portion 180. Since the collector voltage of the IGBT increases when an overcurrent flows through the transistor portion 70, the overcurrent can be detected by providing the sense diode portion 180.

The sense diode portion 180 may have the same structure as the second diode portions 120 as described in FIG. 2 and FIG. 4. Note that the resistivity of the semiconductor substrate 10 in the sense diode portion 180 may be the same as the resistivity of the semiconductor substrate 10 in the first diode portion 80. Also, the area of the sense diode portion 180 on the upper surface of the semiconductor substrate 10 may be larger than or smaller than the total area of the second diode portions 120.

Since the gate control is not performed on the sense diode portion 180, a deviation of the switching timing between the sense diode portion 180 and the transistor portion 70 does not occur, as opposed to the case where a transistor device for sensing is used. Also, the loss in the sense diode portion 180 can be reduced to a very small level by reducing the current flowing through the sense diode portion 180 during forward bias.

Also, the sense diode portion 180 can be formed in the same process in which the first diode portion 80 is formed by forming the sense diode portion 180 and the first diode portion 80 in the same semiconductor substrate 10. Also, since a diode element for sensing need not be added outside the semiconductor device 100, the number of components can be reduced.

Also, while for the formation of the transistor for sensing, the variations of characteristics is increased since a fine region such as a source region of N+ type is formed, for the formation of the sense diode portion 180, the variation of characteristic can be reduced since such a fine source region and the like are not formed. Also, since the sense diode portion 180 is easily miniaturized, it is easy to integrate the sense diode portion 180 into the semiconductor device 100 even if the semiconductor device 100 is miniaturized.

The sense diode portion 180 may be arranged in the region surrounded by the edge termination structure 112 on the upper surface of the semiconductor substrate 10 and may be arranged outside the edge termination structure 112. In the example of FIG. 16, the sense diode portion 180 is arranged in the region surrounded by the edge termination structure 112 on the upper surface of the semiconductor substrate 10. Also, the sense diode portion 180 may be added to any of the aspects described in FIG. 1 to FIG. 15.

Figure 17:
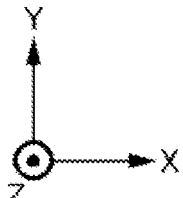
FIG. 17 shows yet another example of a configuration on the upper surface of the semiconductor device 100.

FIG. 17 shows yet another example of a configuration on the upper surface of the semiconductor device 100. In the present example, sandwiched by two transistor portions 70, each second diode portion 120 is provided in a striped form in the XY plane. The width of the second diode portion 120 in the X-axis direction may be the same as, or smaller than the width of the first diode portion 80 in the X-axis direction. The length of the second diode portion 120 in the Y-axis direction may be the same as, or different from the length of the first diode portion 80 in the Y-axis direction. Also in the present example, the second well region 122 is preferably provided between the second diode portion 120 and the transistor portion 70. Also, although the sense diode portion 180 is provided in the example shown in FIG. 17, the semiconductor device 100 may not include the sense diode portion 180.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a semiconductor substrate including a first region having a first thickness and a second region having a second thickness that is different from the first thickness;
an upper-surface electrode provided above an upper surface of the semiconductor substrate;
a drift region of a first conductivity type provided inside the semiconductor substrate;
a buffer region provided on a lower-surface of the drift region and having a higher doping concentration than the drift region;
a cathode region of the first conductivity type that is exposed at a lower surface of the semiconductor substrate across the first region and the second region, the cathode region having a higher doping concentration than the drift region;
a base region of a second conductivity type provided in the first region and between the drift region and the upper surface of the semiconductor substrate; and
an anode region of the second conductivity type provided in the second region and between the drift region and the upper surface of the semiconductor substrate;
wherein
a main element portion is provided in the first region,
the second region is provided in a region other than the main element portion,
the base region is an anode of a first diode portion provided in the first region and not extending into the second region,
the anode region is an anode of a second diode portion provided in the second region, and
the first diode portion is formed in a region having the first thickness in the first region, and the second diode portion is formed in a region having the second thickness in the second region.

2. The semiconductor device according to claim 1, further comprising:
an edge termination structure including a guard ring to surround a main element portion on the upper surface of the semiconductor substrate, the main element portion being provided in the first region, wherein
the second diode portion is disposed at a region surrounded by the guard ring on the upper surface of the semiconductor substrate.

3. The semiconductor device according to claim 1, wherein
a thickness of the drift region in the first diode portion is different from a thickness of the drift region in the second diode portion.

4. The semiconductor device according to claim 1, further comprising:
a gate runner portion provided above the upper surface of the semiconductor substrate, wherein
the first diode portion of the first region and the second diode portion of the second region are disposed to sandwich the gate runner portion.

5. The semiconductor device according to claim 1, wherein a doping concentration of the base region in the first diode portion is different from a doping concentration of the anode region in the second diode portion.

6. The semiconductor device according to claim 1, wherein
the upper-surface electrode is in contact with the base region in the first diode portion and the anode region in the second diode portion.

7. The semiconductor device according to claim 1, wherein
a polysilicon connected to the upper-surface electrode is included above at least one of the base region in the first diode portion or the anode region in the second diode portion.

8. The semiconductor device according to claim 1, wherein
the second diode portion includes a separation well region of the second conductivity type that is provided from the upper surface of the semiconductor substrate to a position deeper than the anode region and has a higher doping concentration than the anode region, and
the first diode portion and the second diode portion are separated by the separation well region.

9. The semiconductor device according to claim 1, further comprising:
a plurality of trench portions provided from the upper surface of the semiconductor substrate so as to reach the drift region, each of the plurality of trench portions having linear parts extending in a linear shape along a first direction in a top view, wherein
the base region is provided in a region sandwiched between the linear parts of each of the plurality of trench portions.

10. The semiconductor device according to claim 1, further comprising:
a trench portion that is provided from the upper surface of the semiconductor substrate so as to reach the drift region and has linear parts extending in a linear shape along a first direction in a top view, wherein
the linear parts of the trench portion end within the first region.

11. The semiconductor device according to claim 1, wherein
a lifetime killer is included in at least one of the first diode portion or the second diode portion.

12. The semiconductor device according to claim 1, wherein
the second thickness of the second region is smaller than the first thickness of the first region.

13. The semiconductor device according to claim 1, further comprising:
an edge termination structure that surrounds a main element portion on the upper surface of the semiconductor substrate, the main element portion being provided in the first region, wherein
a step connecting the first region and the second region is provided between the main element portion and the edge termination structure.

14. The semiconductor device according to claim 1, further comprising:
a collector region of the second conductivity type that is exposed at the lower surface of the semiconductor substrate and has a higher doping concentration than the base region.

15. The semiconductor device according to claim 1, wherein
the semiconductor substrate is a silicon substrate.

16. The semiconductor device according to claim 1, wherein
the semiconductor substrate is a silicon carbide substrate.

17. A semiconductor device comprising:
a semiconductor substrate including a first region having a first thickness and a second region having a second thickness that is different from the first thickness;
an upper-surface electrode provided above an upper surface of the semiconductor substrate;
a drift region of a first conductivity type provided inside the semiconductor substrate;
a buffer region provided on a lower-surface of the drift region and having a higher doping concentration than the drift region;
a cathode region of the first conductivity type that is exposed at a lower surface of the semiconductor substrate, the cathode region having a higher doping concentration than the drift region;
a base region of a second conductivity type provided in the first region and between the drift region and the upper surface of the semiconductor substrate;
an anode region of the second conductivity type provided in the second region and between the drift region and the upper surface of the semiconductor substrate; and
a plurality of trench portions that are provided from the upper surface of the semiconductor substrate so as to reach the drift region and each having linear parts extending in a linear shape along a first direction in a top view, wherein
the linear parts of the trench portion end within the first region; and wherein
a main element portion is provided in the first region,
the second region is provided in a region other than the main element portion,
the base region is an anode of a first diode portion provided in the first region, sandwiched in a width direction between a pair of the trench portions having the linear parts, the base region facing toward the cathode region in a depth direction,
the anode region is an anode of a second diode portion provided in the second region, and
the first diode portion is formed in a region having the first thickness in the first region, and the second diode portion is formed in a region having the second thickness in the second region.

18. A semiconductor device comprising:
a semiconductor substrate including a first region having a first thickness and a second region having a second thickness that is different from the first thickness;
an upper-surface electrode provided above an upper surface of the semiconductor substrate;
a drift region of a first conductivity type provided inside the semiconductor substrate;
a buffer region provided on a lower-surface of the drift region and having a higher doping concentration than the drift region;
a cathode region of the first conductivity type that is exposed at a lower surface of the semiconductor substrate, the cathode region having a higher doping concentration than the drift region;
a base region of a second conductivity type provided in the first region and between the drift region and the upper surface of the semiconductor substrate; and
an anode region of the second conductivity type provided in the second region and between the drift region and the upper surface of the semiconductor substrate; and an edge termination structure that surrounds a main element portion on the upper surface of the semiconductor substrate, the main element portion being provided in the first region, wherein a step connecting the first region and the second region is provided between the main element portion and the edge termination structure;

wherein the second region is provided in a region other than the main element portion, the base region is an anode of a first diode portion provided in the first region, facing toward a portion of the cathode region in the first region, the anode region is an anode of a second diode portion provided in the second region, facing toward a portion of the cathode region in the second region, and the first diode portion is formed in a region having the first thickness in the first region, and the second diode portion is formed in a region having the second thickness in the second region.

* * * * *